(12) United States Patent
Chiang et al.

(10) Patent No.: US 12,136,679 B2
(45) Date of Patent: Nov. 5, 2024

(54) SEMICONDUCTOR DEVICE COMPRISING A PHOTODETECTOR WITH REDUCED DARK CURRENT

(71) Applicant: Taiwan Semiconductor Manufacturing Company, Ltd., Hsin-Chu (TW)

(72) Inventors: Chen-Hao Chiang, Jhongli (TW); Shih-Wei Lin, Taipei (TW); Eugene I-Chun Chen, Taipei (TW); Yi-Chen Chen, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/311,292

(22) Filed: May 3, 2023

(65) Prior Publication Data
US 2023/0299217 A1    Sep. 21, 2023

Related U.S. Application Data

(62) Division of application No. 16/910,566, filed on Jun. 24, 2020, now Pat. No. 11,749,762.

(Continued)

(51) Int. Cl.
*G02B 6/12* (2006.01)
*G02B 6/124* (2006.01)
(Continued)

(52) U.S. Cl.
CPC .... *H01L 31/02327* (2013.01); *G02B 6/12004* (2013.01); *G02B 6/124* (2013.01);
(Continued)

(58) Field of Classification Search
CPC .................. G02B 6/12; G02B 6/131
See application file for complete search history.

(56) References Cited

U.S. PATENT DOCUMENTS 5,347,601 A * 9/1994 Ade .................. H04B 10/40
    398/139
5,998,781 A * 12/1999 Vawter .................. H03C 1/34
    250/227.11

(Continued)

FOREIGN PATENT DOCUMENTS

TW    201717373 A    5/2017
WO    2018187370 A1    10/2018

OTHER PUBLICATIONS

Virot et al. "Integrated Waveguide PIN Photodiodes Exploiting Lateral Si/Ge/Si Heterojunction." Optics Express 19487, vol. 25, No. 16, published on Aug. 7, 2017.

(Continued)

*Primary Examiner* — Kaveh C Kianni
(74) *Attorney, Agent, or Firm* — Eschweiler & Potashnik, LLC

(57) ABSTRACT

Various embodiments of the present disclosure are directed towards a semiconductor device. The semiconductor device includes a first doped region having a first doping type disposed in a semiconductor substrate. A second doped region having a second doping type different than the first doping type is disposed in the semiconductor substrate and laterally spaced from the first doped region. A waveguide structure is disposed in the semiconductor substrate and laterally between the first doped region and the second doped region. A photodetector is disposed at least partially in the semiconductor substrate and laterally between the first doped region and the second doped region. The waveguide structure is configured to guide one or more photons into the photodetector. The photodetector has an upper surface that (Continued)

continuously arcs between opposite sidewalls of the photodetector. The photodetector has a lower surface that continuously arcs between the opposite sidewalls of the photodetector.

20 Claims, 21 Drawing Sheets

Related U.S. Application Data

(60) Provisional application No. 62/928,633, filed on Oct. 31, 2019.

(51) Int. Cl.
| | |
|---|---|
| G02B 6/13 | (2006.01) |
| G02B 6/136 | (2006.01) |
| H01L 31/02 | (2006.01) |
| H01L 31/0232 | (2014.01) |
| H01L 31/028 | (2006.01) |
| H01L 31/18 | (2006.01) |

(52) U.S. Cl.
CPC ............. *G02B 6/131* (2013.01); *G02B 6/136* (2013.01); *H01L 31/028* (2013.01); *H01L 31/1808* (2013.01); *G02B 2006/12061* (2013.01); *G02B 2006/12107* (2013.01)

(56) References Cited

U.S. PATENT DOCUMENTS

| | | | | |
|---|---|---|---|---|
| 6,670,599 B2* | 12/2003 | Wagner | .................... | H01L 31/12 |
| | | | | 438/141 |
| 6,879,014 B2* | 4/2005 | Wagner | ............... | H01L 31/1872 |
| | | | | 257/434 |
| 7,075,165 B2* | 7/2006 | Leon | .................... | H01L 31/1812 |
| | | | | 257/458 |
| 7,386,207 B2* | 6/2008 | Knights | .............. | H01L 31/1804 |
| | | | | 385/40 |
| 7,522,801 B2* | 4/2009 | Makita | ..................... | G02B 6/42 |
| | | | | 385/129 |
| 8,600,198 B2* | 12/2013 | Sudo | ..................... | G02F 1/2257 |
| | | | | 438/31 |
| 8,765,502 B2* | 7/2014 | Assefa | .................... | H10N 10/01 |
| | | | | 438/69 |
| 9,466,753 B1* | 10/2016 | Ellis-Monaghan | ......................... | |
| | | | | H01L 27/1446 |
| 9,810,840 B2* | 11/2017 | Shi | ....................... | G02B 6/1228 |
| 10,295,743 B2* | 5/2019 | Kunishima | ............ | G02B 6/125 |
| 10,418,407 B2* | 9/2019 | Na | .................... | H01L 27/14612 |
| 10,502,895 B2* | 12/2019 | Shi | ....................... | G02B 6/1228 |
| 10,739,443 B2* | 8/2020 | Na | ......................... | G01S 17/10 |
| 10,802,120 B1* | 10/2020 | LaChapelle | ........... | G01S 7/4814 |
| 10,861,888 B2* | 12/2020 | Na | ..................... | H01L 27/14621 |
| 10,886,312 B2* | 1/2021 | Na | ..................... | H01L 27/14636 |
| 11,079,540 B2* | 8/2021 | Watanuki | ............... | G02F 1/2257 |
| 11,121,271 B2* | 9/2021 | Wang | ............. | H01L 31/035281 |
| 11,404,590 B2* | 8/2022 | Chern | .................... | H01L 31/028 |
| 2002/0074553 A1 | 6/2002 | Starikov et al. | | |
| 2003/0012925 A1* | 1/2003 | Gorrell | ............. | H01L 21/31111 |
| | | | | 257/E21.12 |
| 2006/0039666 A1* | 2/2006 | Knights | ................ | H01L 31/105 |
| | | | | 385/39 |
| 2007/0104411 A1* | 5/2007 | Ahn | .................... | G02B 6/12004 |
| | | | | 385/14 |
| 2007/0280587 A1* | 12/2007 | Makita | ..................... | G02B 6/42 |
| | | | | 438/69 |
| 2009/0166518 A1 | 7/2009 | Tay et al. | | |
| 2010/0164653 A1 | 7/2010 | Cho | | |
| 2010/0327389 A1 | 10/2010 | McCarten et al. | | |
| 2011/0031578 A1* | 2/2011 | Miura | .................. | H01L 31/1124 |
| | | | | 438/59 |
| 2011/0084308 A1* | 4/2011 | Loh | .................... | H01L 21/02639 |
| | | | | 257/190 |
| 2013/0039664 A1* | 2/2013 | Clifton | .................. | H01S 5/3427 |
| | | | | 438/94 |
| 2015/0016769 A1 | 1/2015 | Verma et al. | | |
| 2015/0097256 A1 | 4/2015 | Ang et al. | | |
| 2015/0241648 A1* | 8/2015 | Kikuchi | .......... | H01L 31/035281 |
| | | | | 438/69 |
| 2016/0148959 A1* | 5/2016 | Cheng | ............... | H01L 27/14636 |
| | | | | 438/59 |
| 2016/0155884 A1* | 6/2016 | Hon | ................. | H01L 31/022416 |
| | | | | 257/184 |
| 2016/0197111 A1* | 7/2016 | Coolbaugh | ......... | H01L 31/0232 |
| | | | | 438/69 |
| 2016/0211402 A1 | 7/2016 | Joo et al. | | |
| 2017/0062636 A1 | 3/2017 | Ram et al. | | |
| 2017/0194310 A1* | 7/2017 | Evans | ...................... | H01L 24/09 |
| 2019/0094461 A1* | 3/2019 | Kleinert | ................ | G02B 6/1221 |
| 2020/0028000 A1* | 1/2020 | Wang | ..................... | H01L 31/09 |

OTHER PUBLICATIONS

People et al. "Calculation of Critical Layer Thickness Versus Lattice Mismatch for GexSi1-x/Si Strained-Layer Heterostructures." Appl. Phys. Lett. 47, 322 (2019), published Aug. 1, 1985.
Non-Final Office Action dated Sep. 27, 2022 for U.S. Appl. No. 16/910,566.
Notice of Allowance dated Feb. 10, 2023 for U.S. Appl. No. 16/910,566.

* cited by examiner

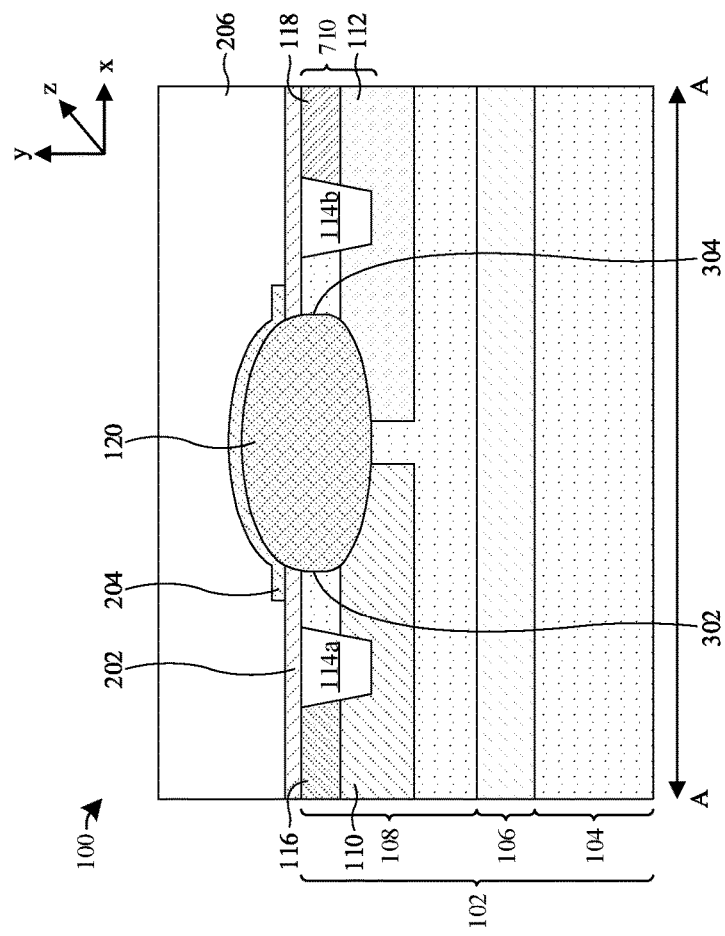
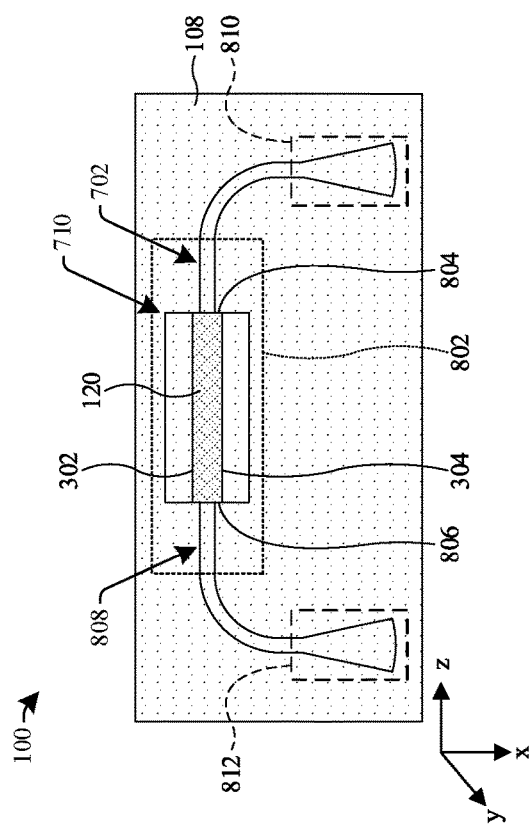
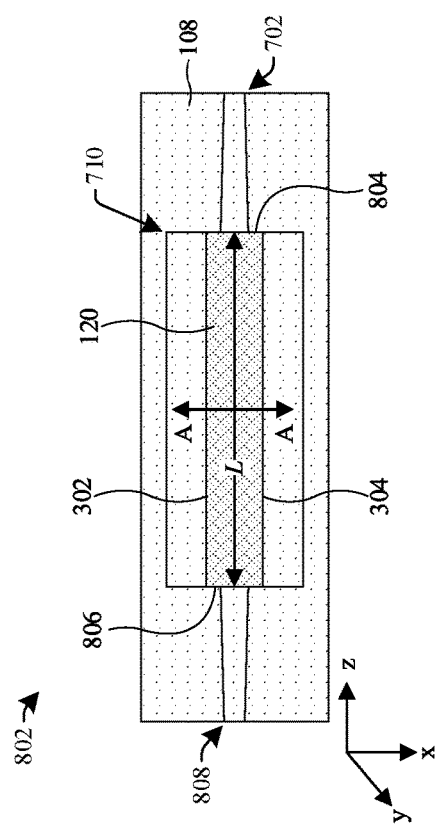
Fig. 8C
Fig. 8A
Fig. 8B

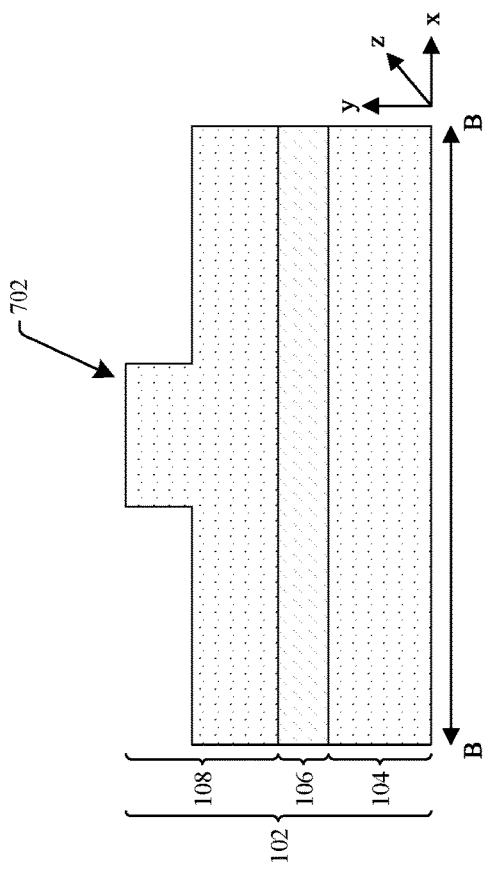
Fig. 10B
Fig. 10C
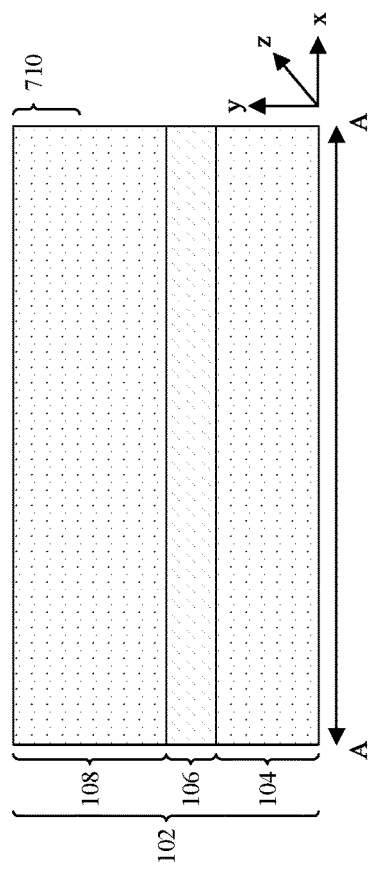
Fig. 10A

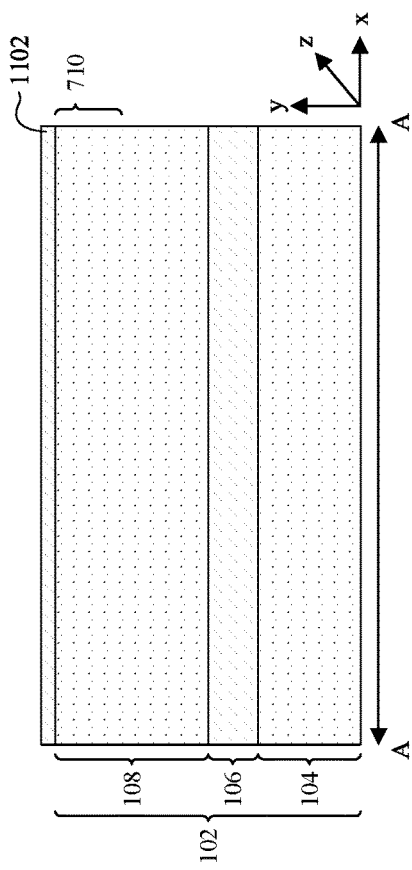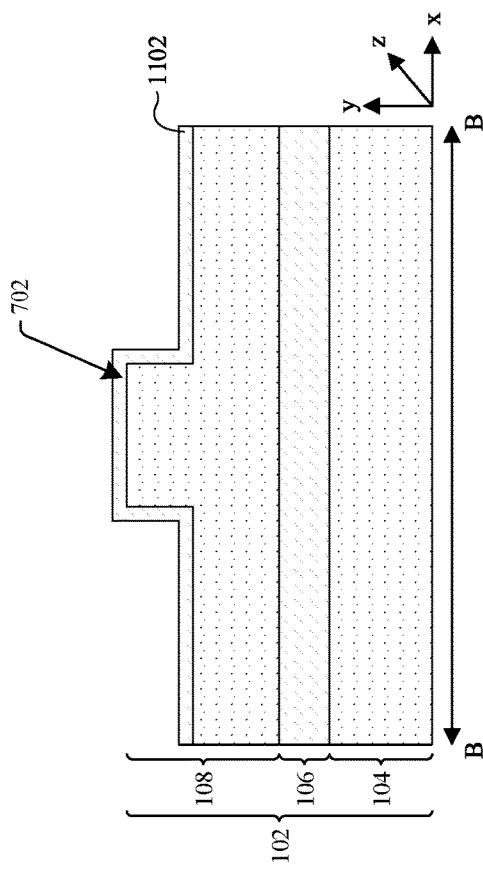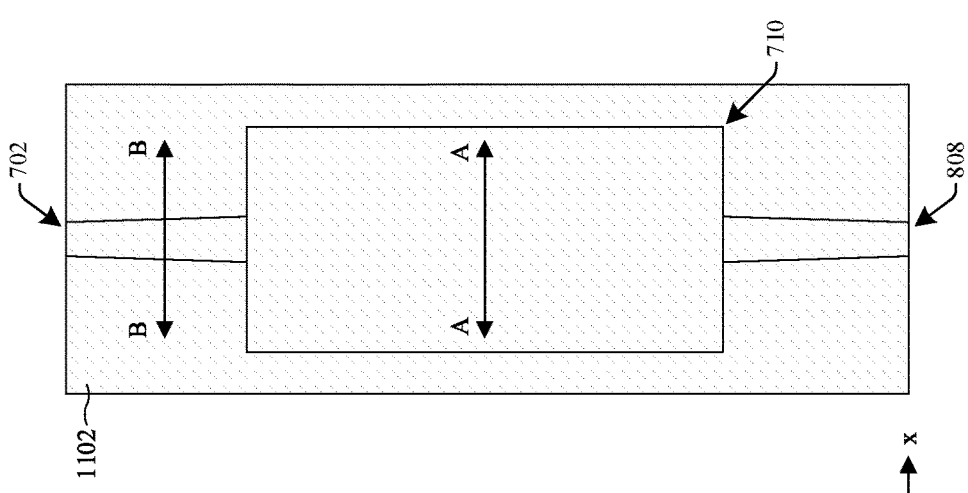

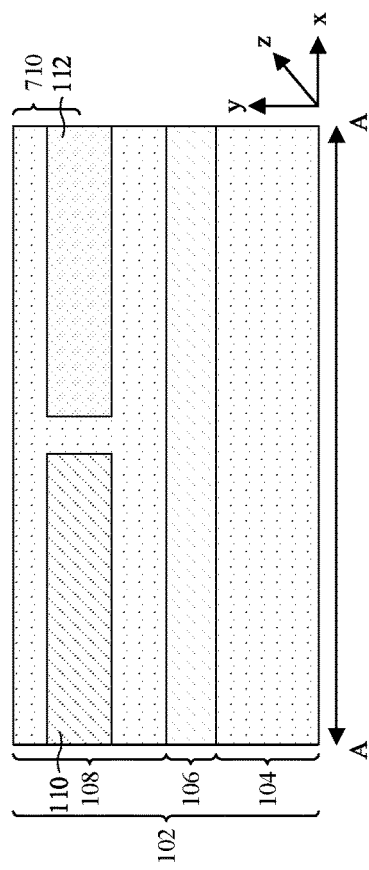
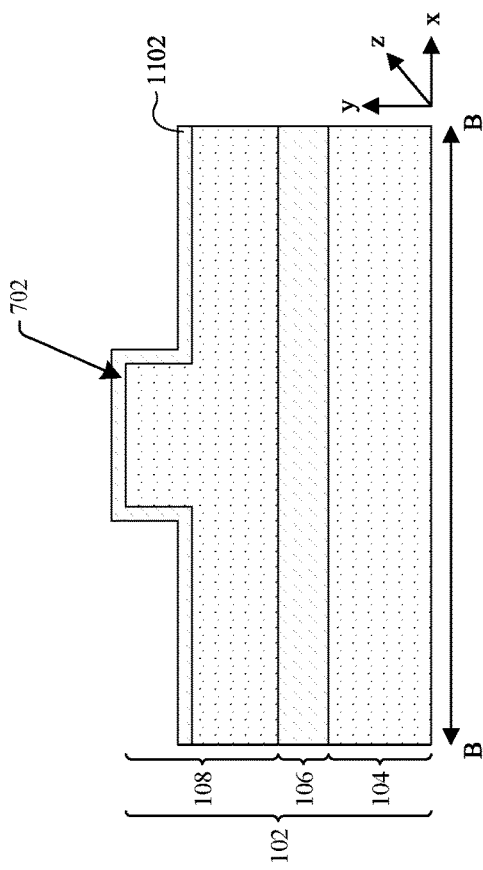
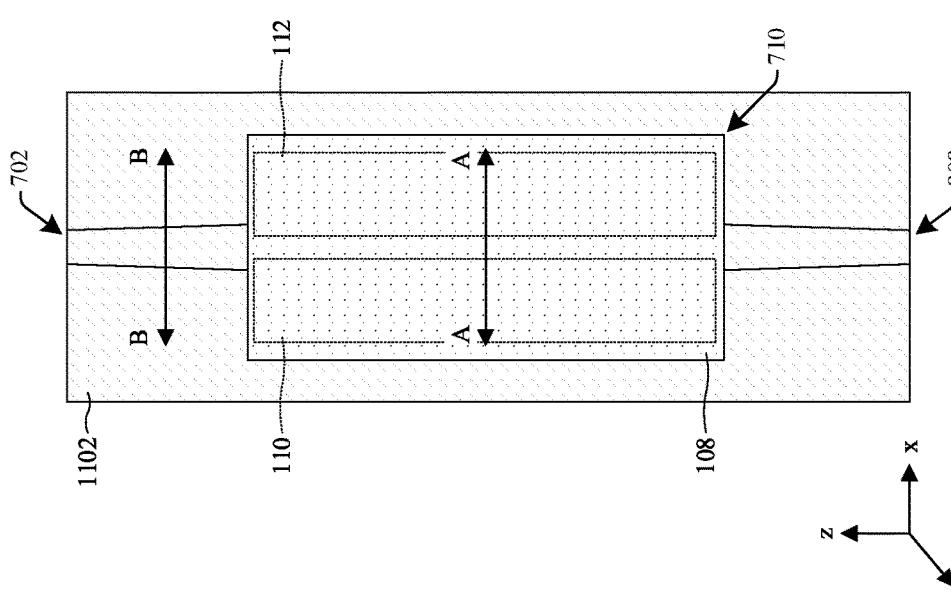
Fig. 12B
Fig. 12C
Fig. 12A

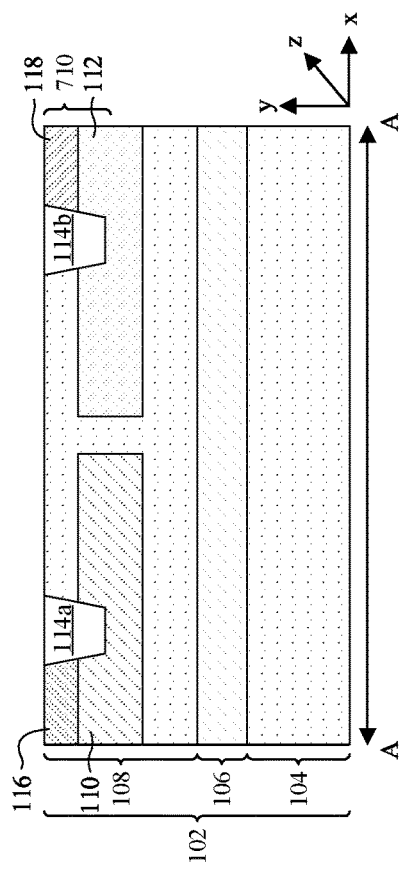
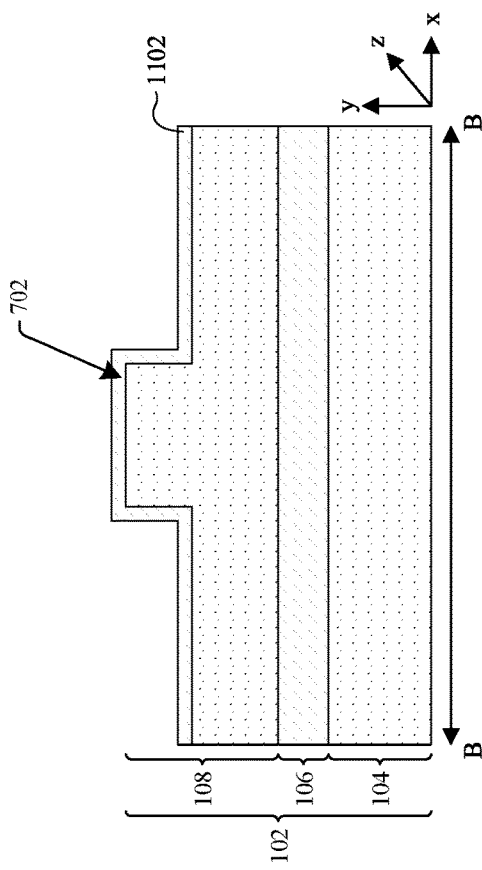
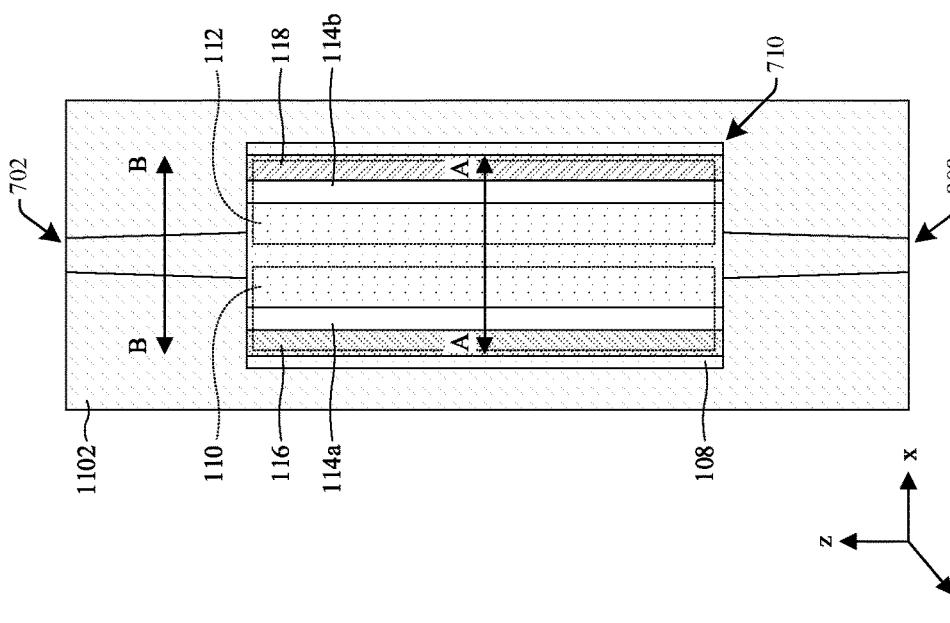
Fig. 14B
Fig. 14C
Fig. 14A

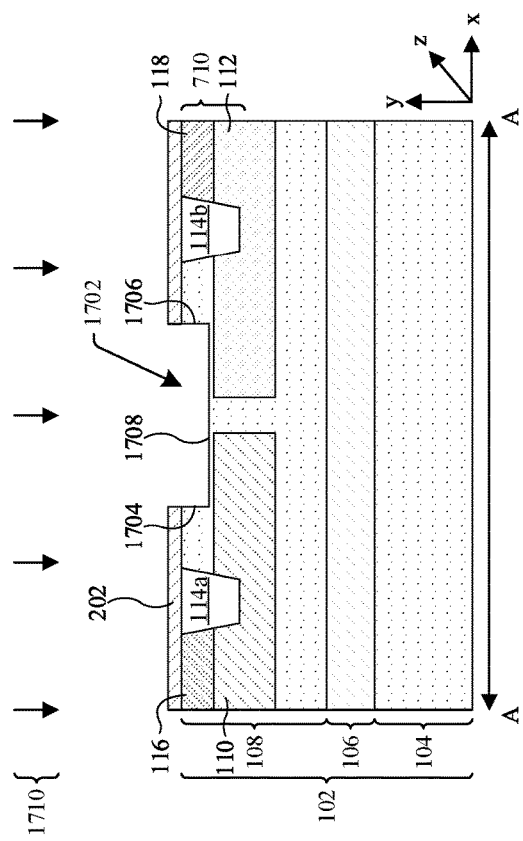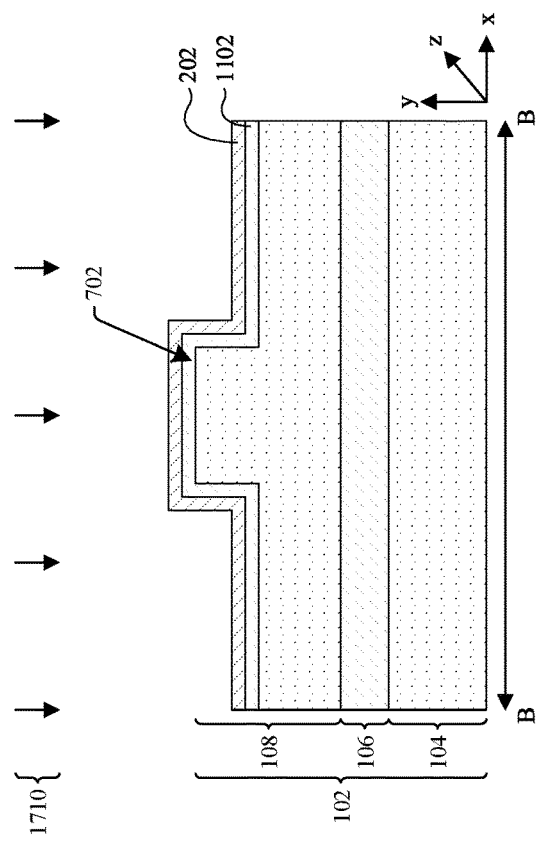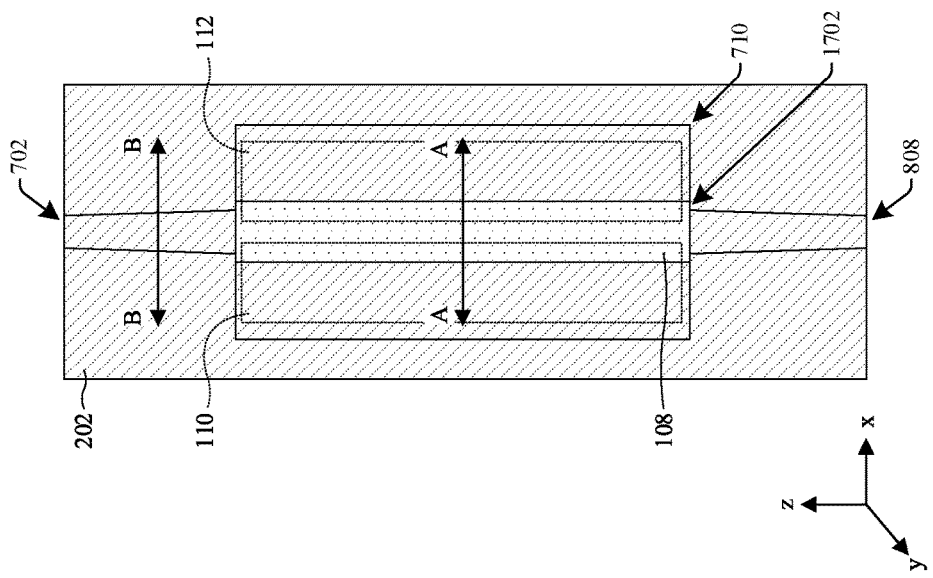

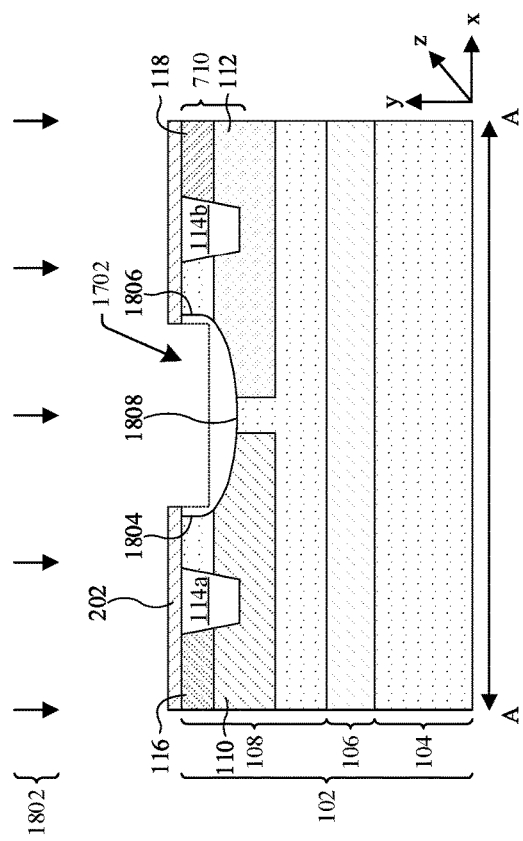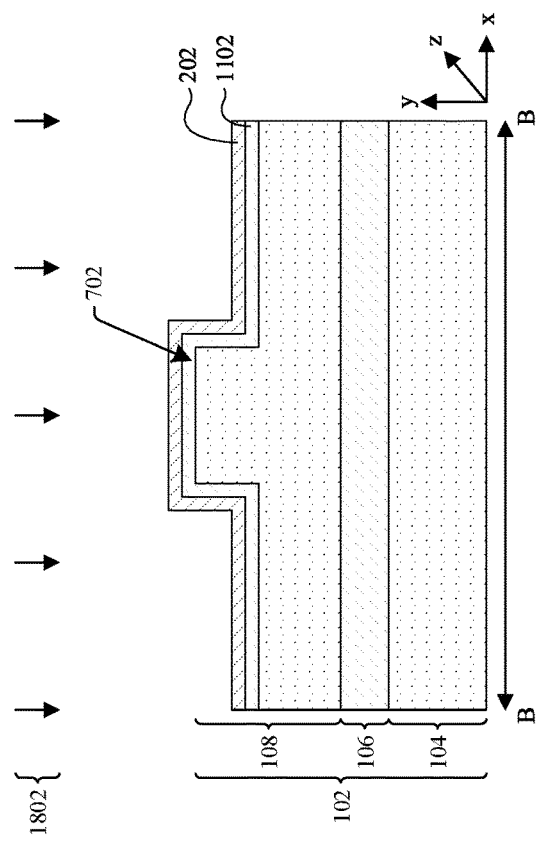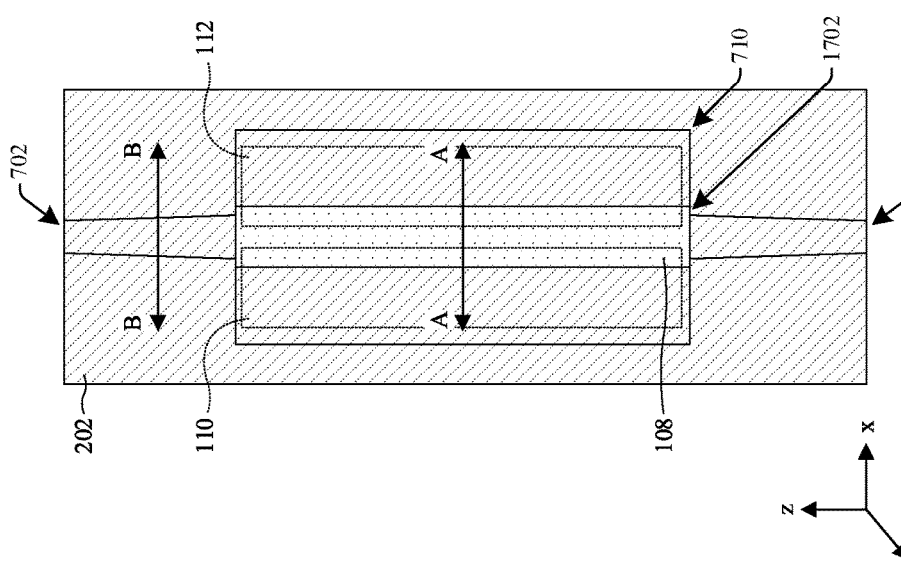
Fig. 18B
Fig. 18C
Fig. 18A

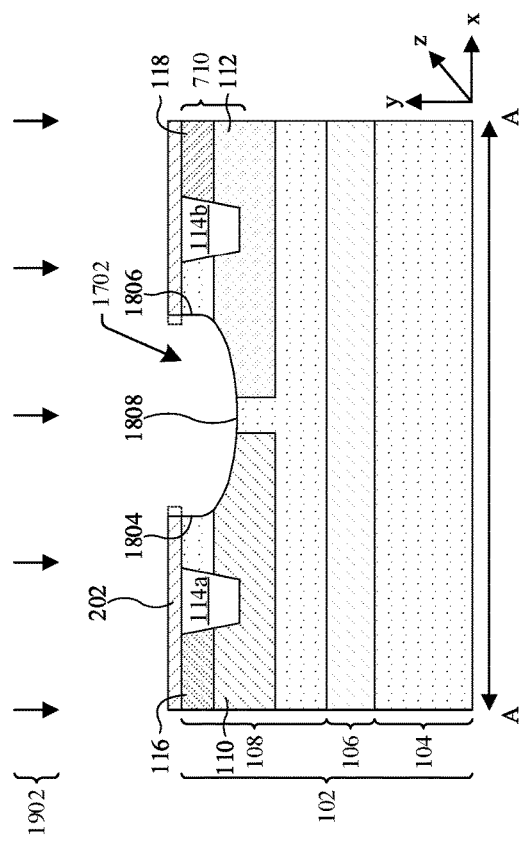
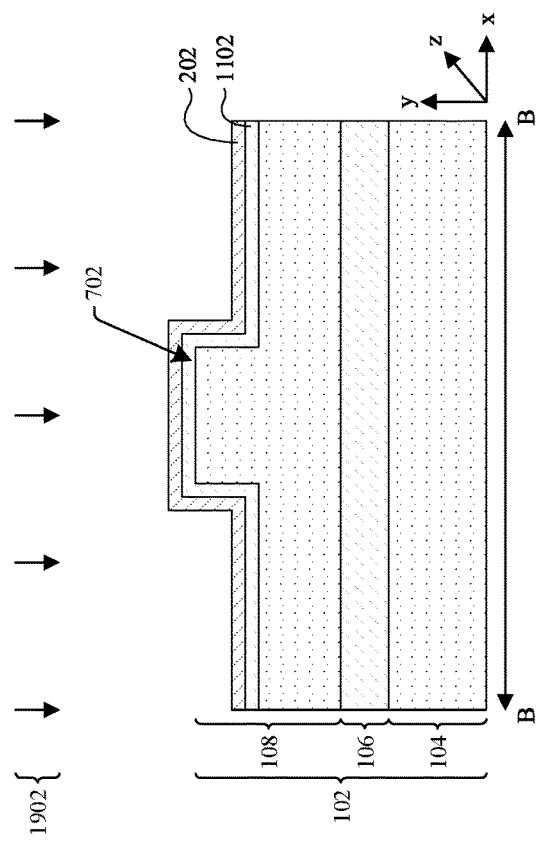
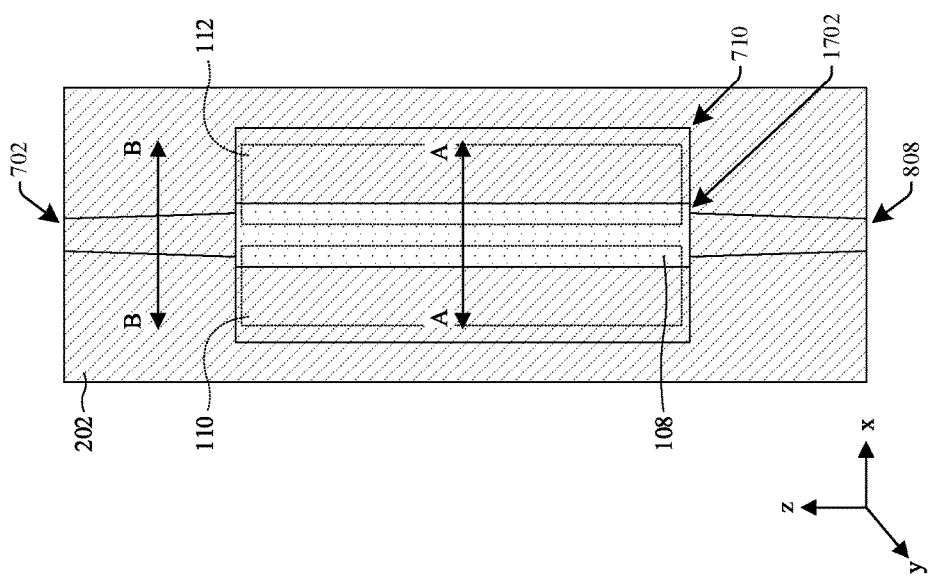
Fig. 19B
Fig. 19C
Fig. 19A

SEMICONDUCTOR DEVICE COMPRISING A PHOTODETECTOR WITH REDUCED DARK CURRENT

REFERENCE TO RELATED APPLICATIONS

This application is a Divisional of U.S. application Ser. No. 16/910,566, filed on Jun. 24, 2020, which claims the benefit of U.S. Provisional Application No. 62/928,633, filed on Oct. 31, 2019. The contents of the above-referenced patent applications are hereby incorporated by reference in their entirety.

BACKGROUND

A photonic integrated circuit (PIC) comprises multiple photonic functions/devices and optical waveguides. PICs utilize light as a carrier of information, much like electrons in electronics. PICs are used in a wide variety of applications, such as optical interconnects for high-speed communication, biosensors for medical diagnostics, etc. One emerging platform for PICs is silicon photonics (e.g., a PIC disposed on a silicon-on-insulator substrate).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8A-8C illustrate various views of some embodiments of the semiconductor device of FIG. 2.

FIGS. 10A-10C through 23A-23C illustrate a series of various views of some embodiments of a method for forming some embodiments of the semiconductor device of FIG. 2.

DETAILED DESCRIPTION

Figure 1:
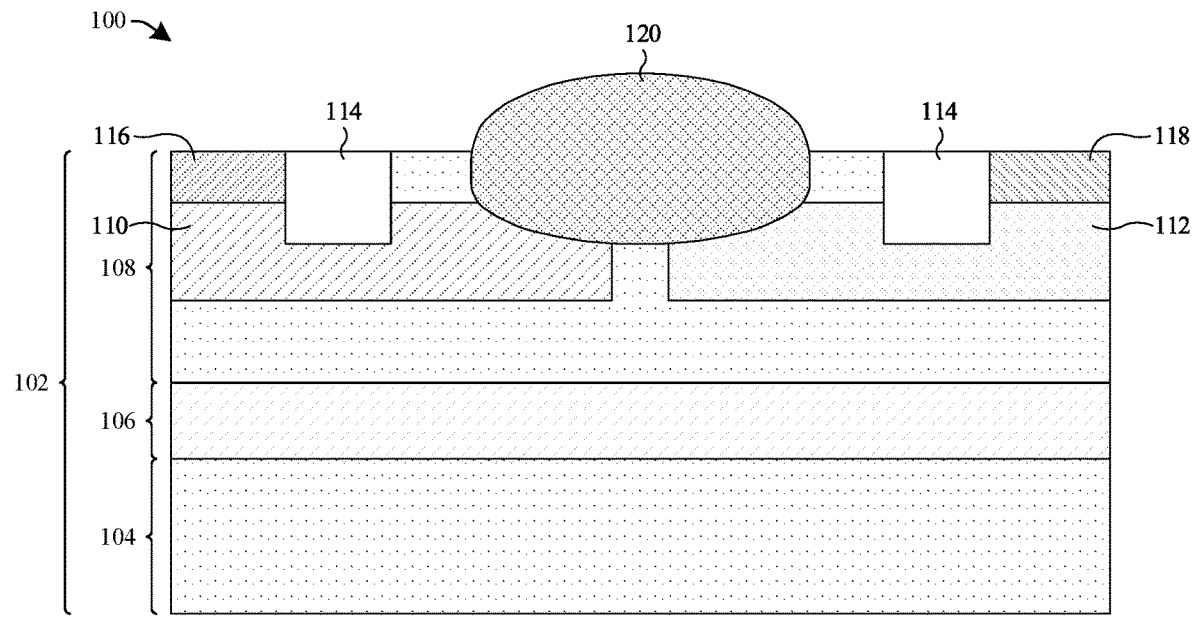
FIG. 1 illustrates a cross-sectional view of some embodiments of a semiconductor device comprising a photodetector with reduced dark current.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a semiconductor device (e.g., photonic integrated circuit) comprises a photodetector and a waveguide structure. The photodetector is disposed on a semiconductor substrate. The photodetector comprises a first semiconductor material (e.g., germanium (Ge)) and the semiconductor substrate comprises a second semiconductor material (e.g., silicon (Si)) that is different than the first semiconductor material. The waveguide structure is configured to guide one or more photons from a first location into the photodetector. The photodetector is configured to absorb the one or more photons and generate electrical signals corresponding to the one or more photons.

One challenge with the above semiconductor device is dark current. Dark current is electrical current that passes through the photodetector even when no photons are entering the photodetector. One source of dark current in the photodetector is due to defects (and/or dislocations) near the interface between the photodetector and the semiconductor substrate. The defects (and/or dislocations) are due to, at least partially, a lattice mismatch between the first semiconductor material and the second semiconductor material (e.g., about a four percent lattice mismatch between Si and Ge).

For example, in some embodiments, the semiconductor device is a silicon photonic device (e.g., silicon photonic optical transceivers). More specifically, the semiconductor device may be a silicon photonic device configured for use in a fiber optic communication system (e.g., as a silicon photonic optical transceiver configured to absorb electromagnetic radiation having a wavelength between about 1260 nanometers (nm) and about 1625 nm (e.g., telecom optical wavelength bands, O-, E-, S-, C-, and L-bands)). In such embodiments, due to the absorption coefficient of Ge in the telecom optical wavelength bands compared to the absorption coefficient of Si in the telecom optical wavelength bands, the photodetector typically comprises Ge. Further, the Ge photodetector is typically disposed on a Si substrate, which is utilized to form the waveguide structure. Moreover, the Ge photodetector typically has a planar bottom surface and substantially straight sidewalls. Due to the lattice mismatch between Si and Ge, defects (and/or dislocations) are disposed along the interface of the Ge photodetector and the Si substrate. These defects (and/or dislocations) are disposed along the entire portion of the Ge photodetector that contacts the Si substrate (e.g., the surface area of the Ge/Si heterojunction).

In various embodiments, the present application is directed toward a semiconductor device (e.g., silicon photonic device) comprising a semiconductor substrate, a photodetector, and a waveguide structure. The waveguide structure is disposed in the semiconductor substrate. The waveguide structure is configured to guide one or more photons into the photodetector. The photodetector is disposed at least partially in the semiconductor substrate. The semiconductor substrate comprises a first semiconductor material (e.g., Si), and the photodetector comprises a second semiconductor material (e.g., Ge) that is different than the first semiconductor material.

The photodetector has a lower surface that arcs between opposite sidewalls of the photodetector. Because the lower surface arcs between the opposite sidewalls of the photodetector, for a photodetector having a given height, the surface area of the photodetector that contacts the semiconductor substrate is reduced compared to a typical photodetector (e.g., a Ge photodetector of a silicon photonic device). By reducing the surface area of the photodetector that contacts the semiconductor substrate (e.g., the Ge/Si heterojunction), the number of defects (and/or dislocations) may be reduced (e.g., due to the reduced surface area resulting in less overall defects (and/or dislocations)). Thus, the dark current of the photodetector may be improved (e.g., reduced). Accordingly, the semiconductor device may have improved device performance (e.g., reduced noise).

FIG. 1 illustrates a cross-sectional view of some embodiments of a semiconductor device 100 comprising a photodetector 120 with reduced dark current.

As shown in FIG. 1, the semiconductor device 100 (e.g., a photonic integrated circuit) comprises a semiconductor substrate 102. The semiconductor substrate 102 may be or comprise any type of semiconductor body (e.g., monocrystalline silicon/CMOS bulk, silicon-germanium (SiGe), silicon-on-insulator (SOI), etc.).

In some embodiments, the semiconductor substrate 102 is an SOI substrate, as illustrated in FIG. 1. In further embodiments, the semiconductor substrate 102 comprises a first semiconductor layer 104, an insulating layer 106, and a second semiconductor layer 108. The first semiconductor layer 104 is or comprises a semiconductor material (e.g., silicon (Si)). The first semiconductor layer 104 may be or comprise, for example, monocrystalline Si, some other silicon material (e.g., polycrystalline Si), some other semiconductor material (e.g., germanium (Ge)), or a combination of the foregoing. In some embodiments, the first semiconductor layer 104 comprises a single semiconductor material (e.g., Si).

The insulating layer 106 is an electrical insulator and is disposed over the first semiconductor layer 104. The insulating layer 106 may be or comprise, for example, an oxide (e.g., silicon dioxide ($SiO_2$)), aluminum oxide ($Al_2O_3$), titanium oxide ($TiO_2$), tantalum oxide ($Ta_2O_5$), or the like), a high-k dielectric (e.g., a dielectric material with a dielectric constant greater than 3.9), some other electrical insulator, or a combination of the foregoing.

The second semiconductor layer 108 is or comprises a semiconductor material (e.g., Si) and is disposed over the insulating layer 106. The second semiconductor layer 108 may be or comprise, for example, monocrystalline Si, some other Si material, some other semiconductor material, or a combination of the foregoing. In some embodiments, the first semiconductor layer 104 comprises a single semiconductor material (e.g., Si). In further embodiments, the semiconductor material of the second semiconductor layer 108 may be the same semiconductor material as the semiconductor material of the first semiconductor layer 104. In yet further embodiments, the first semiconductor layer 104 is Si, the insulating layer 106 is $SiO_2$, and the second semiconductor layer 108 is Si.

A first doped region 110 is disposed in the semiconductor substrate 102. In some embodiments, the first doped region 110 is disposed in the second semiconductor layer 108 and over the insulating layer 106. In further embodiments, the first doped region 110 is vertically spaced from the insulating layer 106. In yet further embodiments, the first doped region 110 is vertically spaced from an upper surface of the second semiconductor layer 108. The first doped region 110 is a region of the second semiconductor layer 108 having a first doping type (e.g., n-type). The first doped region 110 has a first doping concentration of first doping type dopants (e.g., phosphorus (P), arsenic (As), etc.).

A second doped region 112 is disposed in the semiconductor substrate 102 and laterally spaced from the first doped region 110. In some embodiments, the second doped region 112 is disposed in the second semiconductor layer 108 and over the insulating layer 106. In further embodiments, the second doped region 112 is vertically spaced from the insulating layer 106. In yet further embodiments, the second doped region 112 is vertically spaced from an upper surface of the second semiconductor layer 108. The second doped region 112 is a region of the second semiconductor layer 108 having a second doping type (e.g., p-type) that is different the first doping type. The second doped region 112 has a second doping concentration of second doping type dopants (e.g., boron (B), gallium (Ga), etc.).

An isolation structure 114 (e.g., shallow trench isolation (STI) structure) is disposed in the semiconductor substrate 102. In some embodiments, the isolation structure 114 is disposed in the second semiconductor layer 108 and over the insulating layer 106. In further embodiments, the isolation structure 114 is vertically spaced from the insulating layer 106. In yet further embodiments, the isolation structure is at least partially disposed in the first doped region 110 and/or at least partially disposed in the second doped region 112. For example, the isolation structure 114 extends vertically into the second semiconductor layer 108 to points disposed in the first doped region 110 and/or the second doped region 112. The isolation structure 114 may be or comprise, for example, an oxide (e.g., $SiO_2$), some other dielectric material, or a combination of the foregoing. In yet further embodiments, the isolation structure 114 may comprise one or more liner layers (e.g., silicon nitride (SiN) liner layer).

A third doped region 116 is disposed in the semiconductor substrate 102. The third doped region 116 is electrically coupled to the first doped region 110. In some embodiments, the third doped region 116 is disposed in the second semiconductor layer 108 and over the insulating layer 106. In further embodiments, the third doped region 116 extends vertically from an upper surface of the second semiconductor layer 108 and at least partially into the first doped region 110. The third doped region 116 is a region of the second semiconductor layer 108. The third doped region 116 has the first doping type. The third doped region 116 has a third doping concentration of the first doping type dopants that is greater than the first doping concentration.

A fourth doped region 118 is disposed in the semiconductor substrate 102. The fourth doped region 118 is electrically coupled to the second doped region 112. In some embodiments, the fourth doped region 118 is disposed in the second semiconductor layer 108 and over the insulating layer 106. In further embodiments, the fourth doped region 118 extends vertically from an upper surface of the second semiconductor layer 108 and at least partially into the second doped region 112. The fourth doped region 118 is a region of the second semiconductor layer 108. The fourth doped region 118 has the second doping type. The fourth doped region 118 has a fourth doping concentration of the second doping type dopants that is greater than the second doping concentration.

A photodetector 120 is disposed at least partially in the semiconductor substrate 102. In some embodiments, the photodetector 120 is at least partially disposed in the second semiconductor layer 108. In further embodiments, the photodetector 120 extends vertically over an upper surface of the second semiconductor layer 108. The photodetector 120 is disposed laterally between the first doped region 110 and the second doped region 112. The photodetector 120 is disposed laterally between the third doped region 116 and the fourth doped region 118. The photodetector 120 is configured to absorb incident radiation (e.g., photons) and generate electrical signals corresponding to the radiation.

The photodetector 120 is or comprises a semiconductor material (e.g., Ge, Si, indium gallium arsenide (InGaAs), or the like). More specifically, in some embodiments, the photodetector 120 is an epitaxial semiconductor structure. The semiconductor material of the photodetector 120 is different than the semiconductor material of the semiconductor substrate 102. The semiconductor material of the photodetector 120 is different than the semiconductor material of the second semiconductor layer 108. For example, the second semiconductor layer 108 comprises a first semiconductor material (e.g., Si), and the photodetector 120 comprises a second semiconductor material different than the first semiconductor material (e.g., Ge). In some embodiments, the first semiconductor layer 104 comprises a single semiconductor material (e.g., Ge). For example, in some embodiments, the photodetector 120 is Ge and the second semiconductor layer 108 is Si. It will be appreciated that other types of combinations of different semiconductor materials are possible (e.g., the photodetector 120 may be InGaAs and the second semiconductor layer 108 may be Si).

The photodetector 120 has an upper surface that arcs between opposite sidewalls of the photodetector 120. In other words, the upper surface of the photodetector 120 is rounded. In some embodiments, the upper surface of the photodetector 120 arcs continuously between the opposite sidewalls of the photodetector 120. In further embodiments, the upper surface of the photodetector 120 is an uppermost surface of the photodetector 120.

The photodetector 120 has a lower surface that arcs between opposite sidewalls of the photodetector 120. In other words, the lower surface of the photodetector 120 is rounded. In some embodiments, the lower surface of the photodetector 120 arcs continuously between the opposite sidewalls of the photodetector 120. In further embodiments, the lower surface of the photodetector 120 is a lowermost surface of the photodetector 120.

Because the lower surface arcs between the opposite sidewalls of the photodetector 120, the photodetector 120 may have improved (e.g., decreased) dark current. For example, because the lower surface arcs between the opposite sidewalls of the photodetector 120, for a photodetector having a given height, the surface area of the photodetector 120 that contacts the second semiconductor layer 108 is reduced compared to a typical germanium photodetector disposed on a silicon substrate (e.g., a typical germanium photodetector having a planar bottom surface and substantially straight opposite sidewalls). By reducing the surface area of the photodetector 120 that contacts the second semiconductor layer 108, the dark current of the photodetector 120 may be improved (e.g., due to less defects along the interface of the photodetector 120 and the second semiconductor layer 108). Accordingly, the semiconductor device 100 may have improved device performance (e.g., reduced noise).

In some embodiments, the semiconductor device 100 may be a silicon photonic device (e.g., silicon photonic optical transceivers). More specifically, the semiconductor device 100 may be a silicon photonic device configured for use in a fiber optic communication system (e.g., as a silicon photonic optical transceiver configured to absorb electromagnetic radiation having a in the telecom optical wavelength bands)). In such embodiments, the photodetector 120 must have a sufficient absorption coefficient to ensure the photodetector 120 adequately absorbs electromotive radiation of the desired wavelength (e.g., between about 1260 nm and about 1625 nm). The absorption coefficient of the photodetector is at least partially dependent on the semiconductor material of the photodetector 120. Thus, for a silicon photonic device configured for use in the telecommunication industry, the use of Ge (or some other semiconductor material with a relatively high absorption coefficient (e.g., greater than or equal to about $1 \times 10^5$ m$^{-1}$) in the telecom optical wavelength bands) as the semiconductor material of the photodetector 120 is better suited than Si (or some other semiconductor material with a relatively low absorption coefficient in the telecom optical wavelength bands). In fact, for some silicon photonic devices configured for use in the telecommunication industry, the semiconductor materials with the relatively low absorption coefficients in the telecom optical wavelength bands may be inadequate for use as the semiconductor material of the photodetector 120.

Figure 2:
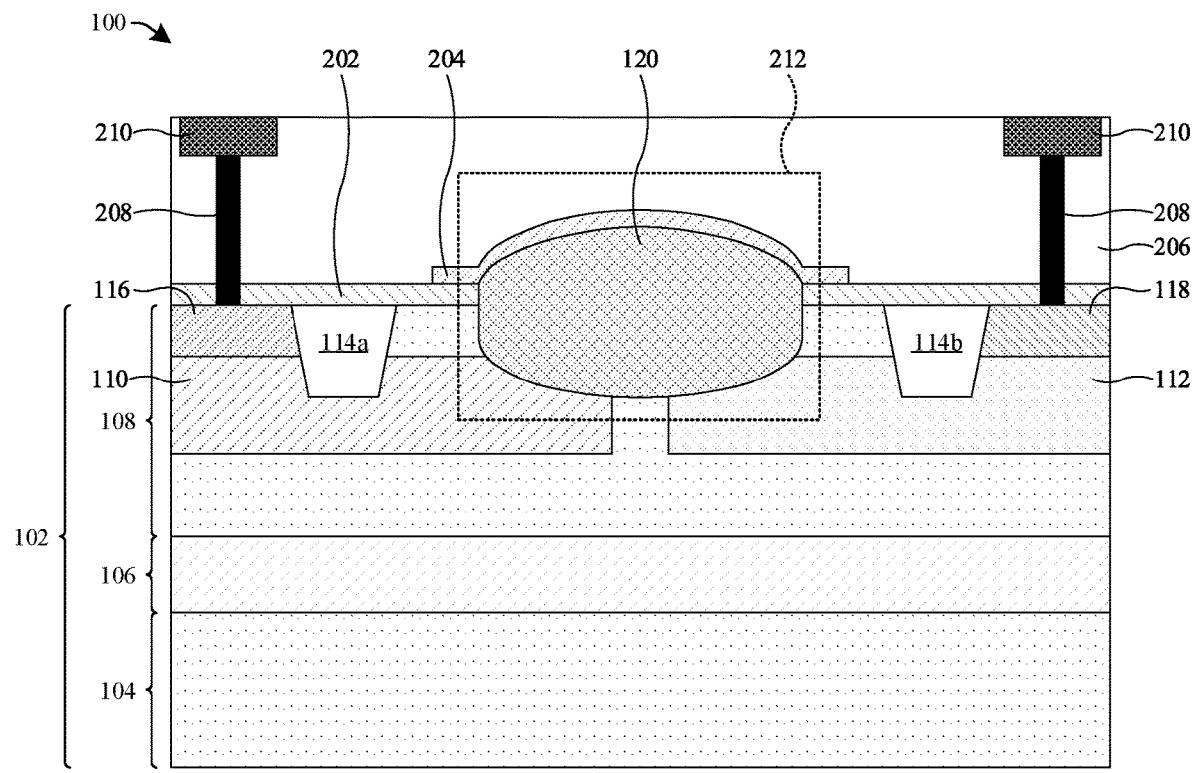
FIG. 2 illustrates a cross-sectional view of some more detailed embodiments of the semiconductor device of FIG. 1.

FIG. 2 illustrates a cross-sectional view of some more detailed embodiments of the semiconductor device 100 of FIG. 1.

As shown in FIG. 2, the isolation structure 114 comprises a first portion 114a and a second portion 114b. The first portion 114a of the isolation structure 114 is disposed on a first side of the photodetector 120, and the second portion 114b of the isolation structure 114 is disposed on a second side of the photodetector 120 opposite the first side of the photodetector 120. In some embodiments, the first portion 114a of the isolation structure 114 is laterally spaced from the second portion 114b of the isolation structure 114. In further embodiments, the first portion 114a of the isolation structure 114 and the second portion 114b of the isolation structure 114 are discrete structures (e.g., not connected by some other portion of the isolation structure 114). In other embodiments, the first portion 114a of the isolation structure 114 and the second portion 114b of the isolation structure 114 are connected together by other portions of the isolation structure 114 that extend laterally through the second semiconductor layer 108.

The first portion 114a of the isolation structure 114 may be disposed between the photodetector 120 and the third doped region 116. The first portion 114a of the isolation structure 114 may be laterally spaced from the first side of the photodetector 120. The first portion 114a of the isolation structure 114 may extend vertically from an upper surface of the second semiconductor layer 108 into the first doped region 110.

The second portion 114b of the isolation structure 114 may be disposed between the photodetector 120 and the fourth doped region 118. The second portion 114b of the isolation structure 114 may be laterally spaced from the second side of the photodetector 120. The second portion 114b of the isolation structure 114 may extend vertically from the upper surface of the second semiconductor layer 108 into the second doped region 112.

In some embodiments, the photodetector 120 at least partially overlies the first doped region 110. In further embodiments, the photodetector 120 at least partially overlies the second doped region 112. In yet further embodiments, a first undoped region (e.g., intrinsic region) of the second semiconductor layer 108 may be disposed directly below the photodetector 120 and laterally between the first doped region 110 and the second doped region 112. The first undoped region of the second semiconductor layer 108 may extend vertically from the photodetector 120 to a second undoped region that extends laterally beneath the first doped region 110, the first undoped region, and the second doped region 112.

A masking structure 202 is disposed over the semiconductor substrate 102 and the isolation structure 114. In some embodiments, the masking structure 202 is disposed over the second semiconductor layer 108, the third doped region 116, the isolation structure 114, and the fourth doped region 118. In further embodiments, the masking structure 202 lines an upper surface of the second semiconductor layer 108. The masking structure 202 may be or comprise, for example, an oxide (e.g., $SiO_2$), a nitride (e.g., SiN), an oxy-nitride (e.g., silicon oxy-nitride ($SiO_xN_y$)), some other dielectric material suitable as a masking material, or a combination of the foregoing.

In some embodiments, the masking structure 202 extends laterally from a first sidewall of the photodetector 120 and across the upper surface of the second semiconductor layer 108 to at least partially cover the first doped region 110, at least partially cover the first portion 114a of the isolation structure 114, and at least partially cover the third doped region 116. In further embodiments, the masking structure 202 completely covers the first portion 114a of the isolation structure 114. In some embodiments, the masking structure 202 extends laterally from a second sidewall of the photodetector 120, which is opposite the first sidewall of the photodetector 120, and across the upper surface of the second semiconductor layer 108 to at least partially cover the second doped region 112, at least partially cover the second portion 114b of the isolation structure 114, and at least partially cover the fourth doped region 118. In further embodiments, the masking structure 202 completely covers the second portion 114b of the isolation structure 114.

In some embodiments, opposite inner sidewalls of the masking structure 202 are substantially vertical (e.g., an angle between each of the opposite inner sidewalls of the masking structure 202 and a bottommost surface of the semiconductor substrate 102 is about ninety degrees). In further embodiments, the opposite inner sidewalls of the masking structure 202 engage the first sidewall of the photodetector 120 and the second sidewall of the photodetector 120, respectively. A third undoped region (e.g., intrinsic region) of the second semiconductor layer 108 may be disposed laterally between the first portion 114a of the isolation structure 114 and the photodetector 120 and vertically between the first doped region 110 and the masking structure 202. A fourth undoped region (e.g., intrinsic region) of the second semiconductor layer 108 may be disposed laterally between the second portion 114b of the isolation structure 114 and the photodetector 120 and vertically between the second doped region 112 and the masking structure 202.

A capping structure 204 is disposed over the semiconductor substrate 102, the masking structure 202, and the photodetector 120. The capping structure 204 is configured to protect the photodetector 120 during fabrication of the semiconductor device 100. In some embodiments, the capping structure 204 lines the upper surface of the photodetector 120 and a portion of an upper surface of the masking structure 202. The capping structure 204 may be or comprise, for example, a nitride (e.g., SiN), a semiconductor material (e.g., Si, SiGe, or the like), an oxide (e.g., $SiO_2$), or the like. In some embodiments in which the capping structure 204 is a semiconductor material, the capping structure 204 may have different chemical composition than the photodetector 120. For example, the photodetector 120 is Ge and the capping structure 204 is Si.

The capping structure 204 at least partially covers the upper surface of the photodetector 120. In some embodiments, the capping structure 204 completely covers the upper surface of the photodetector 120. In further embodiments, the capping structure 204 at least partially covers an upper surface of the masking structure 202. A first sidewall of the capping structure 204 is disposed between the first portion 114a of the isolation structure 114 and the first sidewall of the photodetector 120. A second sidewall of the capping structure 204, which is opposite the first sidewall of the capping structure 204, is disposed between the second portion 114b of the isolation structure 114 and the second sidewall of the photodetector 120. In some embodiments, the capping structure 204 is a conformal layer. In further embodiments, the capping structure 204 has an arced upper surface that corresponds to the arced upper surface of the photodetector 120.

An interlayer dielectric (ILD) structure 206 is disposed over the semiconductor substrate 102, the isolation structure 114, the photodetector 120, the masking structure 202, and the capping structure 204. The ILD structure 206 comprises one or more stacked ILD layers, which may respectively comprise a low-k dielectric (e.g., a dielectric material with a dielectric constant less than about 3.9), an oxide (e.g., ($SiO_2$), or the like. In some embodiments, an uppermost surface of the ILD structure 206 is substantially planar.

A plurality of conductive contacts 208 (e.g., metal contacts) and a plurality of conductive lines 210 (e.g., metal lines) are disposed in the ILD structure 206. In some embodiments, the conductive contacts 208 and the conductive lines 210 are part of an interconnect structure embedded in the ILD structure 206. Although not shown, it will be appreciated that any number of other conductive features (e.g., conductive lines and conductive vias) may be disposed over and electrically coupled to the conductive contacts 208 and the conductive lines 210.

The conductive contacts 208 extend vertically from the semiconductor substrate 102 to the conductive lines 210. For example, a first conductive contact of the conductive contacts 208 extends vertically from the third doped region 116 to a first conductive line of the conductive lines 210, and a second conductive contact of the conductive contacts 208 extends vertically from the fourth doped region 118 to a second conductive line of the conductive lines 210. The third doped region 116 provides a low resistance path between the first conductive contact of the conductive contacts 208 and the first doped region 110. The fourth doped region 118 provides a low resistance path between the second conductive contact of the conductive contacts 208 and the second doped region 112. The conductive contacts 208 may be or comprise, for example, tungsten (W), copper (Cu), aluminum (Al), some other conductive material, or a combination of the foregoing. The conductive lines 210 may be or comprise, for example, Cu, Al, gold (Au), silver (Ag), some other conductive material, or a combination of the foregoing.

It will be appreciated that, in some embodiments, the conductive lines 210 may be bond pads that are bonded to bond pads of a separate semiconductor die/wafer (e.g., a complementary metal-oxide-semiconductor (CMOS) die comprising IC devices for processing signals from the semiconductor device 100). It will be appreciated that, in other embodiments, the conductive lines 210 and conductive contacts 208 are electrically coupled to bond pads that overlie the conductive lines 210 and are disposed in the ILD structure 206.

Figure 3:
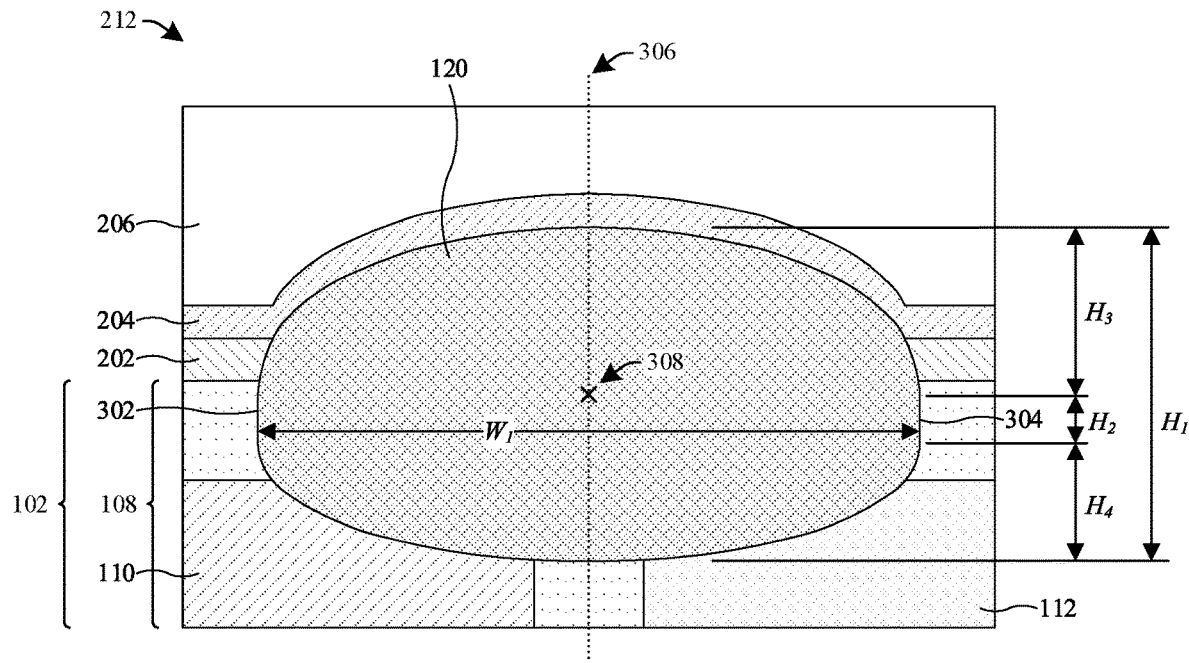
FIG. 3 illustrates a magnified cross-sectional view of some embodiments of an area of FIG. 2.

FIG. 3 illustrates a magnified cross-sectional view of some embodiments of an area 212 of FIG. 2.

As shown in FIG. 3, the photodetector 120 has a first sidewall 302 and a second sidewall 304 opposite the first sidewall 302. The first sidewall 302 is laterally spaced from the second sidewall 304. In some embodiments, the upper surface of the photodetector 120 arcs continuously from the first sidewall 302 to the second sidewall 304. In further embodiments, the lower surface of the photodetector 120 arcs continuously from the first sidewall 302 to the second sidewall 304. In further embodiments, the first sidewall 302 is substantially vertical (e.g., an angle between the first sidewall 302 and a bottommost surface of the semiconductor substrate 102 is about ninety degrees). In yet further embodiments, the second sidewall 304 is substantially vertical.

The photodetector 120 has a first width $W_1$. The first width $W_1$ of the photodetector 120 is a distance between the first sidewall 302 and the second sidewall 304. In some embodiments, the first width $W_1$ of the photodetector 120 is between about 0.3 micrometers (um) and about 1.5 um. If the first width $W_1$ of the photodetector 120 is less than 0.3 um, the dark current of the photodetector 120 may be negatively affected (e.g., increased) due to the small width causing a high electron field. If the first width $W_1$ of the photodetector 120 is greater than 1.5 um, the dark current of the photodetector 120 may be negatively affected (e.g., increased) without an appreciable benefit in other performance parameters of the semiconductor device 100. In further embodiments, the first width $W_1$ of the photodetector 120 is between about 0.3 um and 1.0 um. In some embodiments, if the first width $W_1$ of the photodetector 120 is greater than 1.0 um, the dark current of the photodetector 120 may be negatively affected (e.g., increased) without an appreciable benefit in other performance parameters of the semiconductor device 100.

The photodetector 120 has a first height $H_1$. The first height $H_1$ is a distance along a centerline 306 of the photodetector 120 from the uppermost surface of the photodetector 120 to the bottommost surface of the photodetector 120. The centerline 306 intersects a center point 308 of the photodetector 120. The center point 308 is spaced an equal distance from the first sidewall 302 and the second sidewall 304, and the center point 308 is spaced an equal distance from an uppermost point of the uppermost surface of the photodetector 120 and a lowermost point of the lowermost surface of the photodetector 120. In some embodiments, the first height $H_1$ is a maximum overall height of the photodetector 120. In further embodiments, the first height $H_1$ is between about 200 nm and about 400 nm. In yet further embodiments, the center point 308 of the photodetector 120 is disposed below an upper surface of the second semiconductor layer 108 (and/or upper surface of the semiconductor substrate 102).

A central region of the photodetector 120 has a second height $H_2$. The central region of the photodetector 120 is disposed between an upper region of the photodetector and a lower region of the photodetector. The upper region of the photodetector has a third height $H_3$. The lower region of the photodetector 120 has a fourth height $H_4$.

The central region of the photodetector is bound by a lower boundary of the upper region of the photodetector 120, an upper boundary of the lower region of the photodetector 120, the first sidewall 302, and the second sidewall 304. The lower boundary of the upper region of the photodetector 120 extends in a linear line from an uppermost point of the first sidewall 302 to an uppermost point of the second sidewall 304. The upper boundary of the lower region of the photodetector 120 extends in a linear line from a lowermost point of the first sidewall 302 to a lowermost point of the second sidewall 304. In other words, in some embodiments, the central region of the photodetector 120 has a rectangular-like profile, the upper region of the photodetector 120 has a semicircle-like profile, and the lower region of the photodetector 120 has a semicircular-like profile.

The second height $H_2$ is a distance along the centerline 306 from the lower boundary of the upper region of the photodetector 120 to the upper boundary of the lower region of the photodetector 120. In some embodiments, the second height $H_2$ is between about 100 nm and 200 nm. The third height $H_3$ is a distance along the centerline 306 from the uppermost surface of the photodetector 120 to the lower boundary of the upper region of the photodetector 120. In some embodiments, the third height $H_3$ is between about 50 nm and 100 nm. The fourth height $H_4$ is a distance along the centerline 306 from the lowermost surface of the photodetector 120 to the upper boundary of the lower region of the photodetector 120. In some embodiments, the fourth height $H_4$ is between about 50 nm and 100 nm. In further embodiments, the third height $H_3$ is different than the fourth height $H_4$. In other embodiments, the third height $H_3$ is substantially the same as the fourth height $H_4$. The overall height of the photodetector 120 continuously decreases from the centerline 306 to the first sidewall 302, and the overall height of the photodetector 120 continuously decreases from the centerline 306 to the second sidewall 304.

In some embodiments, opposite inner sidewalls of the masking structure 202 are arced. The arced inner sidewalls of the masking structure 202 may arc continuously from a bottom surface of the masking structure 202 to an upper surface of the masking structure 202. In further embodiments, the arced inner sidewalls of the masking structure 202 correspond to the arc of the upper surface of the photodetector 120. In other embodiments, the opposite inner sidewalls of the masking structure 202 may have an arced portion and a linear portion. In further embodiments, the arced portions of the inner sidewalls of the masking structure 202 may correspond to the arced upper surface of the photodetector, and the linear portions of the inner sidewalls of the masking structure 202 may correspond to the angle of the first sidewall 302 and the second sidewall 304, respectively.

Figure 4:
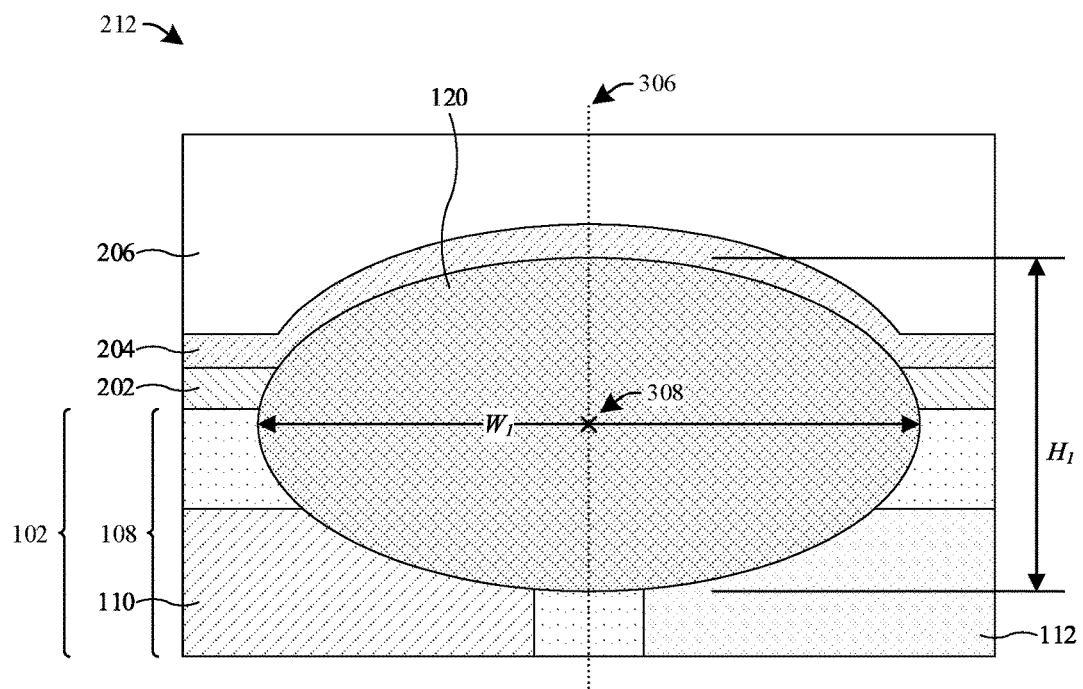
FIG. 4 illustrates a magnified cross-sectional view of some other embodiments of the area of FIG. 2.

FIG. 4 illustrates a magnified cross-sectional view of some other embodiments of the area 212 of FIG. 2.

As shown in FIG. 4, a perimeter of the photodetector 120 continuously arcs without any linear portions. In such embodiments, the photodetector 120 may have an elliptical-like profile. It will be appreciated that the photodetector 120 may have a different geometrically shaped profile (e.g., circle-like) that has a continuously arcing perimeter. In further such embodiments, the photodetector 120 has opposite sidewalls that are arced, an upper surface that continuously arcs between the opposite arced sidewalls of the photodetector 120, and a bottom surface that arcs between the opposite arced sidewalls of the photodetector 120. In other such embodiments, the photodetector 120 may be described as having a continuously arcing upper surface and a continuously arcing bottom surface that are connected together at opposite points.

Figure 5:
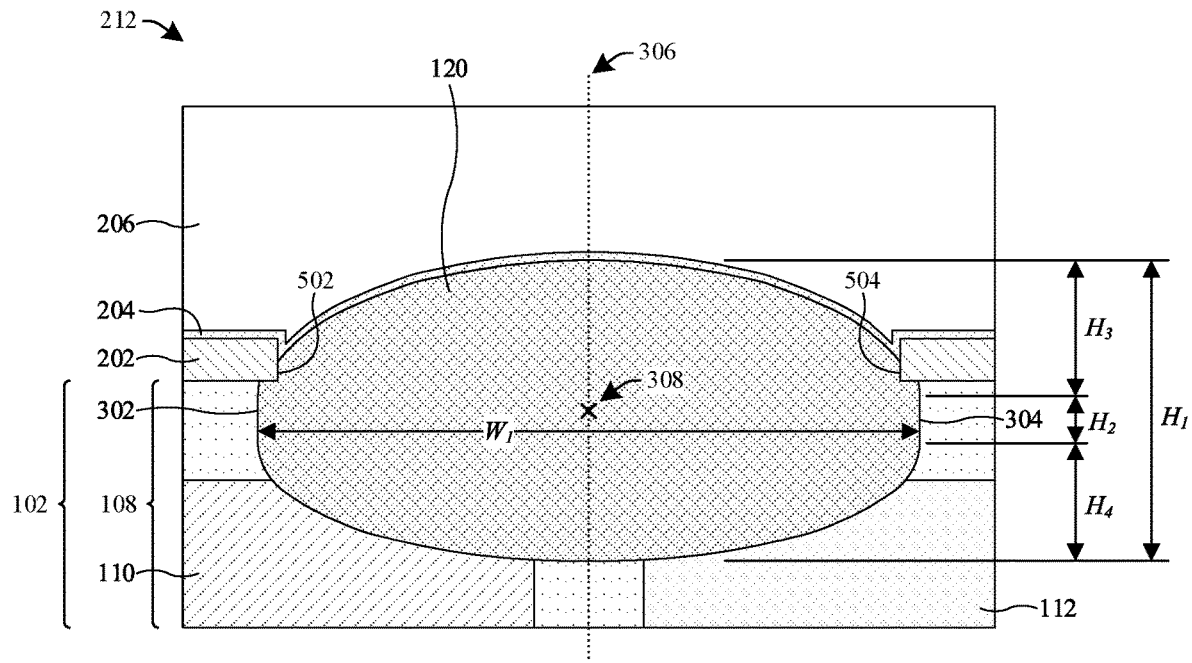
FIG. 5 illustrates a magnified cross-sectional view of some other embodiments of the area of FIG. 2.

FIG. 5 illustrates a magnified cross-sectional view of some other embodiments of the area 212 of FIG. 2.

As shown in FIG. 5, the photodetector has a third sidewall 502 and a fourth sidewall 504 opposite the third sidewall 502. The third sidewall 502 is laterally spaced from the fourth sidewall 504. The third sidewall 502 and the fourth sidewall 504 are disposed on opposite sides of the centerline 306 of the photodetector 120. The third sidewall 502 is disposed laterally between the centerline 306 of the photodetector 120 and the first sidewall 302. The fourth sidewall 504 is disposed laterally between the centerline 306 of the photodetector 120 and the second sidewall 304.

In some embodiments, a first upper surface of the photodetector 120 arcs continuously from the third sidewall 502 to the fourth sidewall 504. In further embodiments, the third sidewall 502 is substantially vertical. In yet further embodiments, the fourth sidewall 504 is substantially vertical.

A second upper surface of the photodetector 120 extends from the third sidewall 502 to the first sidewall 302. In some embodiments, the second upper surface of the photodetector 120 is substantially planar. In other embodiments, the second upper surface of the photodetector 120 may have a planar portion and an arced portion that connects the planar portion of the second upper surface of the photodetector 120 to the first sidewall 302. A third upper surface of the photodetector 120 extends from the fourth sidewall 504 to the second sidewall 304. In some embodiments, the third upper surface of the photodetector 120 is substantially planar. In other embodiments, the third upper surface of the photodetector 120 may have a planar portion and an arced portion that connects the planar portion of the third upper surface of the photodetector 120 to the second sidewall 304.

In some embodiments, the masking structure 202 at least partially overlies the photodetector 120. In further embodiments, the masking structure 202 overlies a first portion of the photodetector 120 disposed on a first side of the centerline 306 and overlies a second portion of the photodetector 120 disposed on a second side of the centerline opposite the first side. The third sidewall 502 may engage a first inner sidewall of the masking structure 202. The fourth sidewall 504 may engage a second inner sidewall of the masking structure 202 opposite the first inner sidewall of the masking structure 202. The second upper surface of the photodetector 120 may engage a first bottom surface of the masking structure 202. The third upper surface of the photodetector 120 may engage a second bottom surface of the masking structure 202.

The capping structure 204 lines the first upper surface of the photodetector 120. The capping structure 204 may line at least a portion of the upper surface of the masking structure 202, at least a portion of the first inner sidewall of the masking structure 202, and at least a portion of the second inner sidewall of the masking structure 202. As shown in FIG. 5, the capping structure 204 layer lines the first upper surface of the photodetector 120, and the capping structure 204 at least partially lines the portion of the upper surface of the masking structure 202, the portion of the first inner sidewall of the masking structure 202, and the portion of the second inner sidewall of the masking structure 202. In such embodiments, the capping structure 204 may have a planar upper surface disposed over the masking structure 202 and an arced upper surface over the first upper surface of the photodetector 120. In further such embodiments, the capping structure 204 may have substantially vertical outer sidewalls that engage the first inner sidewall of the masking structure 202 and the second inner sidewall of the masking structure 202, respectively.

Figure 6:
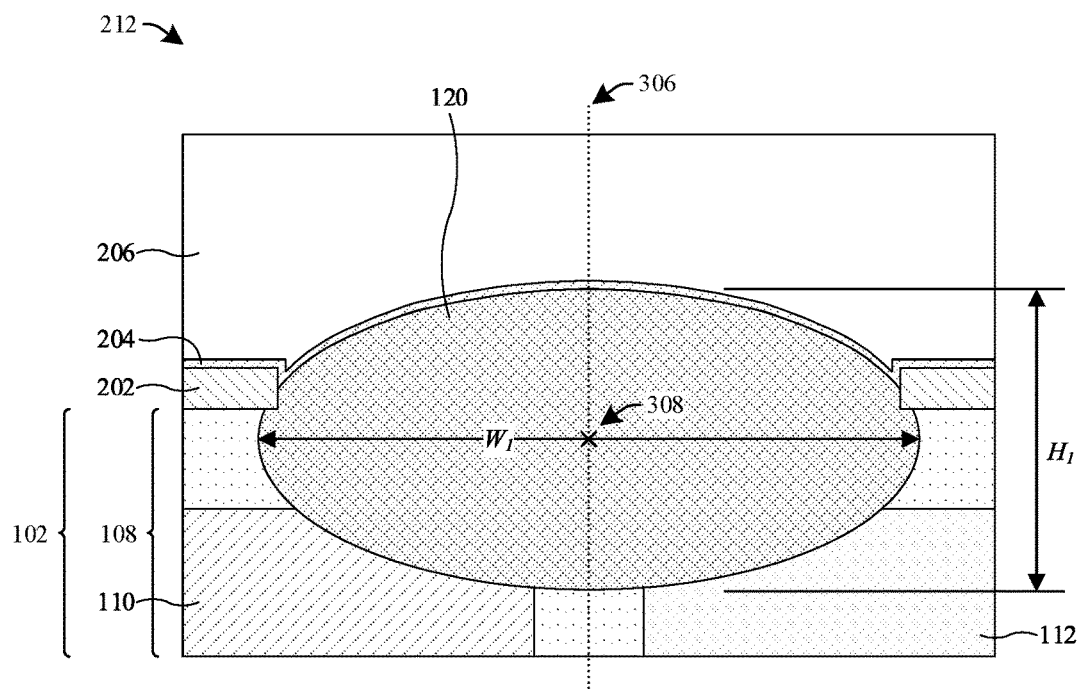
FIG. 6 illustrates a magnified cross-sectional view of some other embodiments of the area of FIG. 2.

FIG. 6 illustrates a magnified cross-sectional view of some other embodiments of the area 212 of FIG. 2.

As shown in FIG. 6, the bottom surface of the photodetector 120 may continuously arc from the second upper surface of the photodetector 120 to the third upper surface of the photodetector 120, and the first upper surface of the photodetector 120 may arc continuously from the third sidewall 502 to the fourth sidewall 504.

Figure 7:
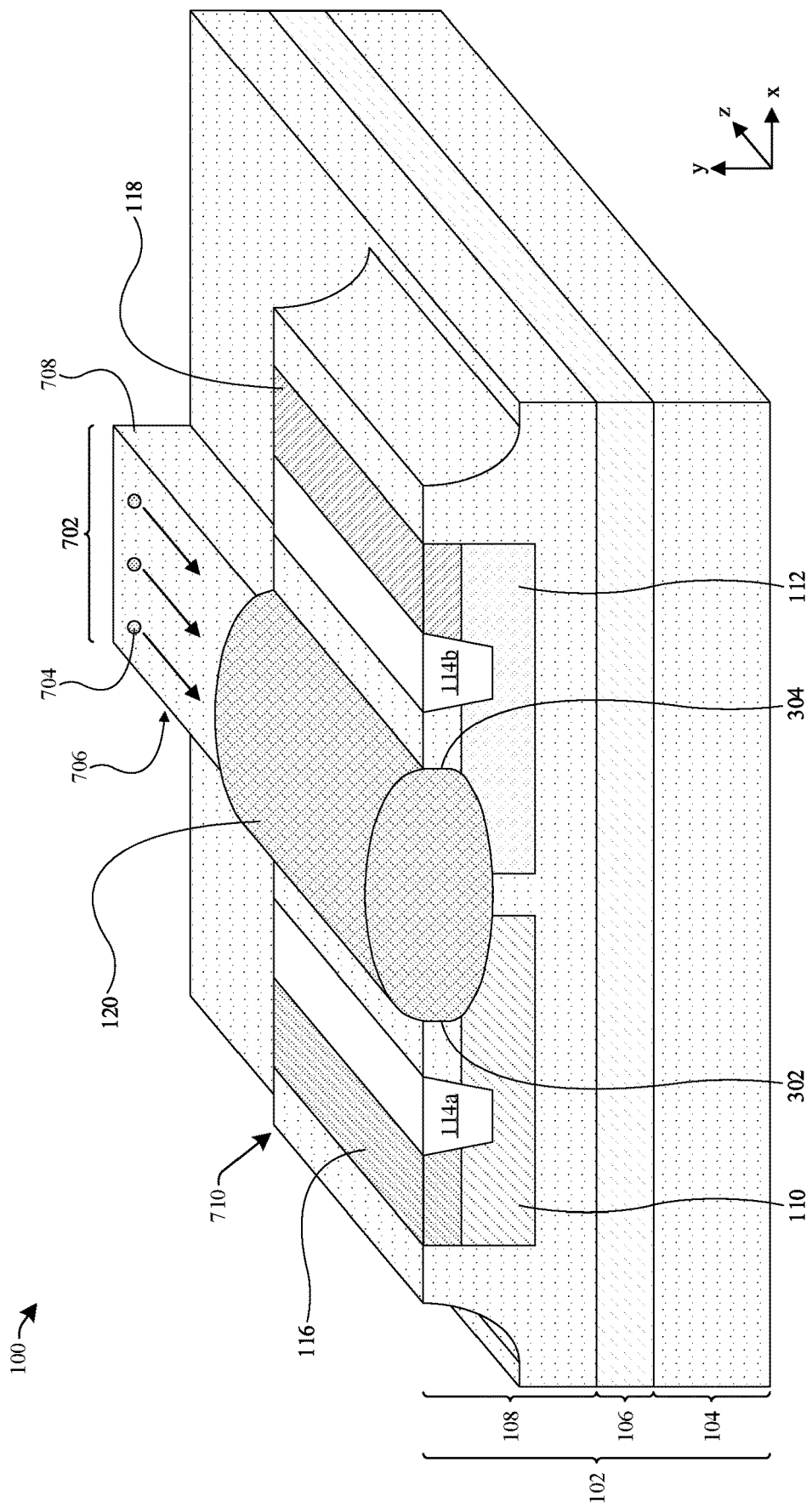
FIG. 7 illustrates a perspective view of some embodiments of the semiconductor device of FIG. 1.

FIG. 7 illustrates a perspective view of some embodiments of the semiconductor device of FIG. 1.

As shown in FIG. 7, the semiconductor device 100 comprises a first waveguide structure 702. The first waveguide structure 702 is disposed in the semiconductor substrate 102. In some embodiments, the first waveguide structure 702 is disposed in the second semiconductor layer 108. The first waveguide structure 702 is configured to guide (illustrated in FIG. 7 with arrows) one or more photons 704 (e.g., optical photons) from a location external to the photodetector 120 into the photodetector 120.

The first waveguide structure 702 is or comprises a semiconductor material (e.g., Si, Ge, SiGe, etc.). The semiconductor material of the first waveguide structure 702 may be different than the semiconductor material of the photodetector 120. For example, the first waveguide structure 702 is Si, and the photodetector 120 is Ge. In some embodiments, the first waveguide structure 702 comprises a single semiconductor material (e.g., Si). In further embodiments, the first waveguide structure 702 is a portion of the semiconductor substrate 102. In yet further embodiments, the first waveguide structure 702 is a portion of the second semiconductor layer 108. In other words, the first waveguide structure 702 may be defined by a portion of the second semiconductor layer 108.

The first waveguide structure 702 is disposed laterally between the first doped region 110 and the second doped region 112. In some embodiments, the first waveguide structure 702 laterally overlaps at least a portion of the first doped region 110 and/or at least a portion of the second doped region 112. In other embodiments, the first waveguide structure 702 is disposed between a side of the first doped region 110 and a side of the second doped region 112 that face one another. The first waveguide structure 702 is disposed laterally between the first portion 114a of the isolation structure 114 and the second portion 114b of the isolation structure 114. The first waveguide structure 702 is disposed laterally between the third doped region 116 and the fourth doped region 118.

In some embodiments, an upper surface of the first waveguide structure 702 is substantially planar. In further embodiments, the upper surface of the first waveguide structure 702 is disposed below the upper surface of the photodetector 120. The first waveguide structure 702 comprises a fifth sidewall 706 and a sixth sidewall 708 opposite the fifth sidewall 706. In some embodiments, the fifth sidewall 706 and the sixth sidewall 708 are substantially vertical.

In some embodiments, the second semiconductor layer 108 defines a semiconductor pedestal 710. The semiconductor pedestal 710 is a portion of the second semiconductor layer 108. The first doped region 110 and the second doped region 112 are at least partially disposed in the semiconductor pedestal 710. The third doped region 116, the isolation structure 114, and the fourth doped region 118 are disposed in the semiconductor pedestal 710. The photodetector 120 is disposed at least partially in the semiconductor pedestal 710. In some embodiments, opposite sidewalls of the semiconductor pedestal 710 are arced. In further embodiments, the arced sidewalls of the semiconductor pedestal 710 arc continuously from an upper surface of the semiconductor pedestal 710 to an upper surface of the second semiconductor layer 108. In other embodiments, the opposite sidewalls of the semiconductor pedestal 710 may be substantially vertical. The upper surface of the semiconductor pedestal 710 may be co-planar with the upper surface of the first waveguide structure 702. In other embodiments, the upper surface of the semiconductor pedestal 710 may be disposed below (or above) the upper surface of the first waveguide structure 702.

In some embodiments, the first waveguide structure 702 has a square-like or rectangular-like profile along a first plane (e.g., a plane that extends laterally along the x-axis). In further embodiments, the photodetector 120 has a different geometrically shaped profile along a second plane that is parallel with and laterally spaced from the first plane. For example, in some embodiments, the profile of the photodetector 120 along the second plane is obround-like, and the profile of the first waveguide structure 702 along the first plane is rectangular-like, as shown in FIG. 7. In further embodiments, the profile of the photodetector 120 along the second plane is elliptical-like (e.g., having curved sidewalls). In yet further embodiments, the first portion 114a of the isolation structure 114 and the second portion 114b of the isolation structure 114 extend laterally in parallel with the photodetector (e.g., along the z-axis).

FIGS. 8A-8C illustrate various views of some embodiments of the semiconductor device 100 of FIG. 2. FIG. 8A illustrates a simplified layout view of some embodiments of the semiconductor device 100 of FIG. 2. FIG. 8B illustrates a simplified magnified view of an area 802 of FIG. 8A. FIG. 8C illustrates a cross-sectional view of some embodiments of the area 802 taken along line A-A of FIG. 8B. FIGS. 8A-8B are "simplified" because FIGS. 8A-8B do not illustrate various features of the semiconductor device 100 that are illustrated in FIG. 8C (e.g., the ILD structure 206, the capping structure 204, the masking structure 202, the isolation structure 114, the third doped region 116, and the fourth doped region 118).

As shown in FIGS. 8A-8C, the photodetector 120 comprises a seventh sidewall 804 and an eighth sidewall 806 opposite the seventh sidewall 804. The seventh sidewall 804 and the eighth sidewall 806 are laterally spaced from one another in a first direction (e.g., along the z-axis). The first sidewall 302 of the photodetector 120 and the second sidewall 304 of the photodetector 120 are spaced apart in a second direction that is perpendicular to the first direction (e.g., along the x-axis). The photodetector 120 has a length L. The length L of the photodetector 120 is a distance between the seventh sidewall 804 and the eighth sidewall 806. In some embodiments, the length L of the photodetector 120 is less than 100 um. More specifically, the length L of the photodetector 120 may be between about 10 um and 20 um. In further embodiments, the first width $W_1$ of the photodetector 120 is less than the length L of the photodetector 120.

In some embodiments, the semiconductor device 100 comprises the first waveguide structure 702 and a second waveguide structure 808. The second waveguide structure 808 is disposed in the semiconductor substrate 102. The second waveguide structure 808 is configured to guide one or more photons into the photodetector 120. In some embodiments, the second waveguide structure 808 comprises substantially similar features (e.g., structural features) as the first waveguide structure 702.

The semiconductor device 100 may comprise a first grating coupler structure 810 (e.g., an optical grating structure). The first grating coupler structure 810 is disposed in the semiconductor substrate 102. In some embodiments, the first grating coupler structure 810 is disposed in the second semiconductor layer 108. The first grating coupler structure 810 is configured to receive incident radiation (e.g., photons) from an external source (e.g., an optical fiber) and direct or guide the incident radiation into the first waveguide structure 702. For example, an optical fiber, which is external to the semiconductor device 100, may be situated (e.g., vertically coupled, edge coupled, etc.) such that light (e.g. photons) is transmitted from the optical fiber into the first grating coupler structure 810. The first grating coupler structure 810 guides (e.g., splits and diffracts) the light into the first waveguide structure 702, and the first waveguide structure 702 guides the light into the photodetector 120.

The first waveguide structure 702 extends laterally from the seventh sidewall 804 to the first grating coupler structure 810. The first waveguide structure 702 may contact the seventh sidewall 804. In some embodiments, the first waveguide structure 702 has a first lateral portion that extends laterally from the seventh sidewall 804 (along the z-axis) to a first arced portion. The first arced portion of the first waveguide structure 702 extends from the first lateral portion of the first waveguide structure 702 to a second lateral portion of the first waveguide structure 702. In some embodiments, the first lateral portion of the first waveguide structure 702 and the second lateral portion of the first waveguide structure 702 are perpendicular to one another. In such embodiments, the first arced portion of the first waveguide structure 702 has a ninety-degree bend that connects the first lateral portion of the first waveguide structure 702 to the second lateral portion of the first waveguide structure 702.

The first grating coupler structure 810 may have opposite sidewalls that angle inward toward one another. In some embodiments, the sidewalls of the first waveguide structure 702 may angle inward toward one another. In further embodiments, the angled sidewalls of the first waveguide structure 702 may angle inward toward one another from the seventh sidewall 804 to the first grating coupler structure 810. In yet further embodiments, the angled sidewalls of the first grating coupler structure 810 may angle inward toward one another from a curved sidewall of the first grating coupler structure 810 to the first waveguide structure 702.

In some embodiments, a second grating coupler structure 812. The second grating coupler structure 812 is disposed in the semiconductor substrate 102. In some embodiments, the second grating coupler structure 812 is disposed in the second semiconductor layer 108. The second grating coupler structure 812 is configured to receive incident radiation (e.g., photons) from an external source (e.g., an optical fiber) and direct or guide the incident radiation into the second waveguide structure 808. The second grating coupler structure 812 may comprises substantially similar features (e.g., structural features) as the first grating coupler structure 810.

The second waveguide structure 808 extends laterally from the eighth sidewall 806 to the second grating coupler structure 812. The second waveguide structure 808 may contact the eighth sidewall 806. In some embodiments, the second waveguide structure 808 has a third lateral portion that extends laterally from the eighth sidewall 806 (along the z-direction) to a second arced portion. The third lateral portion of the second waveguide structure 808 and the first lateral portion of the first waveguide structure 702 extend in opposite directions away from the photodetector 120. The second arced portion of the second waveguide structure 808 extends from the third lateral portion of the second waveguide structure 808 to a fourth lateral portion of the second waveguide structure 808. In some embodiments, the third lateral portion of the second waveguide structure 808 and the fourth lateral portion of the second waveguide structure 808 are perpendicular to one another. In such embodiments, the second arced portion of the second waveguide structure 808 has a ninety-degree bend that connects the third lateral portion of the second waveguide structure 808 to the fourth lateral portion of the second waveguide structure 808.

The second grating coupler structure 812 may have opposite sidewalls that angle inward toward one another. In some embodiments, the sidewalls of the second waveguide structure 808 may angle inward toward one another. In further embodiments, the angled sidewalls of the second waveguide structure 808 may angled inward toward one another from the eighth sidewall 806 to the second grating coupler structure 812. In yet further embodiments, the angled sidewalls of the second grating coupler structure 812 may angle inward toward one another from a curved sidewall of the second grating coupler structure 812 to the second waveguide structure 808.

Figure 9:
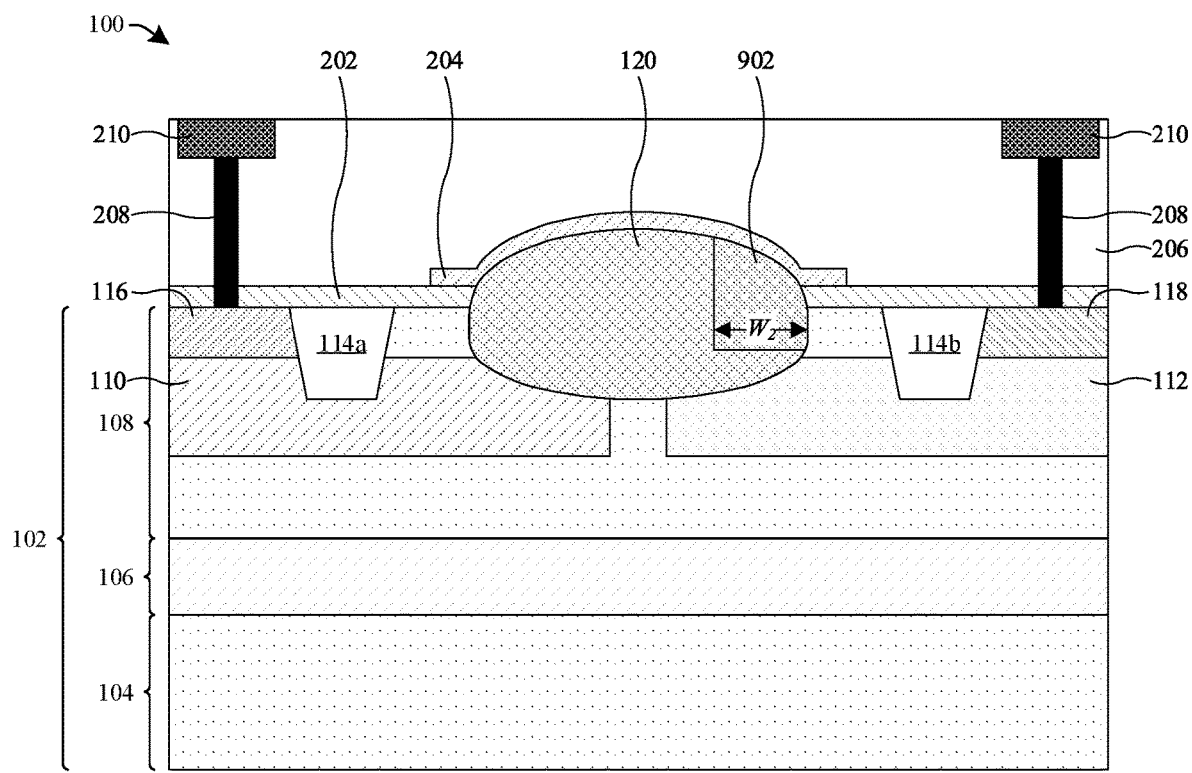
FIG. 9 illustrates a cross-sectional view of some other embodiments of the semiconductor device of FIG. 2.

FIG. 9 illustrates a cross-sectional view of some other embodiments of the semiconductor device 100 of FIG. 2.

As shown in FIG. 9, a fifth doped region 902 is disposed in the photodetector 120. The fifth doped region 902 is a region of the photodetector 120 having the second doping type (e.g., p-type). The fifth doped region 902 may extend laterally between opposite sidewalls of the photodetector 120 (e.g., between the seventh sidewall 804 and the eighth sidewall 806).

The fifth doped region has a second width $W_2$. The second width $W_2$ may be between about 0.15 um and about 0.35 um. In some embodiments, if the first width $W_1$ of the photodetector 120 (see, e.g., FIG. 3) is between about 0.4 um and about 1.1 um, the second width $W_2$ may be about 0.15 um; if the first width $W_1$ of the photodetector 120 is between about 0.4 um and about 1.2 um, the second width $W_2$ may be about 0.2 um; if the first width $W_1$ of the photodetector 120 is between about 0.5 um and about 1.3 um, the second width $W_2$ may be about 0.25 um; if the first width $W_1$ of the photodetector 120 is between about 0.6 um and about 1.4 um, the second width $W_2$ may be about 0.3 um; and if the first width $W_1$ of the photodetector 120 is between about 0.7 um and about 1.5 um, the second width $W_2$ may be about 0.3 um.

FIGS. 10A-10C through 23A-23C illustrate a series of various views of some embodiments of a method for forming some embodiments of the semiconductor device 100 of FIG. 2. Figures with a suffix of "A" (e.g., FIG. 10A) illustrate a series of layout views of some embodiments for forming some embodiments of the semiconductor device 100 of FIG. 2. Figures with the suffix "B" (e.g., FIG. 10B) illustrate a series of cross-sectional views taken along line A-A of corresponding figures of FIGS. 10A-23A (e.g., FIG. 10B illustrates a cross-sectional view of the structure of FIG. 10A taken along line A-A of FIG. 10A). Figures with the suffix "C" (e.g., FIG. 10C) illustrate a series of cross-sectional views taken along line B-B of corresponding figures of FIGS. 10A-23A (e.g., FIG. 10C illustrates a cross-sectional view of the structure of FIG. 10A taken along line B-B of FIG. 10A).

As shown in FIGS. 10A-10C, a semiconductor substrate 102 is provided. In some embodiments, the semiconductor substrate 102 comprises a first semiconductor layer 104, an insulating layer 106, and a second semiconductor layer 108.

A first waveguide structure 702 and a second waveguide structure 808 are formed in the second semiconductor layer 108. The first waveguide structure 702 may be formed with opposite sidewalls that angled toward one another. The second waveguide structure 808 may be formed with opposite sidewalls that angled toward one another. As shown in FIGS. 10A-10C, in some embodiments, the first waveguide structure 702 and the second waveguide structure 808 are portions of the second semiconductor layer 108, respectively.

In some embodiments, a process for forming the first waveguide structure 702 and the second waveguide structure 808 comprises forming a first patterned masking layer (not shown) (e.g., positive/negative photoresist, hardmask, etc.) over the second semiconductor layer 108. In further embodiments, the first patterned masking layer may be formed by forming a masking layer (not shown) on the second semiconductor layer 108, exposing the masking layer to a pattern (e.g., via a lithography process, such as photolithography, extreme ultraviolet lithography, or the like), and developing the masking layer to form the first patterned masking layer. Thereafter, a first etching process is performed to remove unmasked portions of the second semiconductor layer 108, thereby forming the first waveguide structure 702 and the second waveguide structure 808. The first etching process may be a dry etching process, a wet etching process, a reactive ion etching (RIE) process, some other etching process, or a combination of the foregoing. Subsequently, in some embodiments, the first patterned masking layer is stripped away.

Also shown in FIGS. 10A-10C, a semiconductor pedestal 710 is formed in the second semiconductor layer 108. As shown in FIGS. 10A-10C, in some embodiments, the semiconductor pedestal 710 is a portion of the second semiconductor layer 108. The semiconductor pedestal 710 is formed laterally between the first waveguide structure 702 and the second waveguide structure 808. In some embodiments, the semiconductor pedestal 710 may be formed with opposite sidewalls that are arced from an upper surface of the semiconductor pedestal 710 to an upper surface of the second semiconductor layer 108. In other embodiments, the semiconductor pedestal 710 may be formed with the opposite sidewalls of the semiconductor pedestal 710 being substantially vertical. In further embodiments, the semiconductor pedestal 710, the first waveguide structure 702, and the second waveguide structure 808 are formed with upper surfaces that are substantially planar with one another.

In some embodiments, the semiconductor pedestal 710 may be formed by the same process for forming the first waveguide structure 702 and the second waveguide structure 808 (e.g., the semiconductor pedestal 710 is formed by the first etching process removing portions of the second semiconductor layer 108 that are not masked by the first patterned masking layer). In other embodiments, a process for forming the semiconductor pedestal 710 comprises forming a second patterned masking layer (not shown) (e.g., positive/negative photoresist, hardmask, etc.) over the second semiconductor layer 108, the first waveguide structure 702, and the second waveguide structure 808. Thereafter, a second etching process is performed to remove unmasked portions of the second semiconductor layer 108, thereby forming the semiconductor pedestal 710. The second etching process may be a dry etching process, a RIE process, a wet etching process, some other etching process, or a combination of the foregoing. Subsequently, in some embodiments, the second patterned masking layer is stripped away. In some embodiments, a planarization process (e.g., chemical-mechanical polishing (CMP)) may be performed on the first waveguide structure 702, the semiconductor pedestal 710, and the second waveguide structure 808 to planarize the upper surfaces of the first waveguide structure 702, the semiconductor pedestal 710, and the second waveguide structure 808. It will be appreciated that, in some embodiments, the semiconductor pedestal 710 may be formed before the first waveguide structure 702 and/or the second waveguide structure 808.

As shown in FIGS. 11A-11C, a dielectric layer 1102 is formed over the second semiconductor layer 108. The dielectric layer 1102 covers the first waveguide structure 702 and the second waveguide structure 808. In some embodiments, the dielectric layer 1102 covers the semiconductor pedestal 710. In further embodiments, the dielectric layer 1102 is formed as a conformal layer. The dielectric layer 1102 may be or comprise, for example, an oxide (e.g., $SiO_2$), a nitride (e.g., SiN), an oxy-nitride (e.g., silicon oxy-nitride ($SiO_xN_y$)), some other dielectric material, or a combination of the foregoing. In some embodiments, the dielectric layer 1102 is $SiO_2$.

In some embodiments, a process for forming the dielectric layer 1102 comprises depositing or growing the dielectric layer 1102 on and covering the second semiconductor layer 108, the semiconductor pedestal 710, the first waveguide structure 702, and the second waveguide structure 808. The dielectric layer 1102 may be deposited or grown by, for example, chemical vapor deposition (CVD), physical vapor deposition (PVD), atomic layer deposition (ALD), thermal oxidation, some other deposition or growth process, or a combination of the foregoing.

As shown in FIGS. 12A-12C, a first doped region 110 and a second doped region 112 are formed in the second semiconductor layer 108. The first doped region 110 is a region of the second semiconductor layer 108 having a first doping type (e.g., n-type). The second doped region 112 is a region of the second semiconductor layer 108 having a second doping type (e.g., p-type) that is different than the first doping type. In some embodiments, the first doped region 110 and the second doped region 112 are formed in the semiconductor pedestal 710. The first doped region 110 and the second doped region 112 may be formed vertically spaced from the upper surface of the semiconductor pedestal 710. In further embodiments, the first doped region 110 and the second doped region 112 are formed spaced from the opposite sidewalls of the semiconductor pedestal 710. In other embodiments, the first doped region 110 and the second doped region 112 may be formed extending laterally to the opposite sidewalls of the semiconductor pedestal 710, respectively.

In some embodiments, a process for forming the first doped region 110 and the second doped region 112 comprises removing, at least partially, the dielectric layer 1102 from the second semiconductor layer 108. In further embodiments, the portion of the dielectric layer 1102 that is removed from the second semiconductor layer 108 is disposed over the semiconductor pedestal 710. A third patterned masking layer (not shown) is then formed over the semiconductor pedestal 710 and the dielectric layer 1102. Thereafter, a first doping process (e.g., ion implantation) is performed to dope the region of the semiconductor pedestal 710 not covered by the third patterned masking layer with first doping type dopants (e.g., phosphorus (P), arsenic (As), etc.), thereby forming the first doped region 110. Subsequently, in some embodiments, the third patterned masking layer is stripped away. Thereafter, a fourth patterned masking layer (not shown) is formed over the semiconductor pedestal 710 and the dielectric layer 1102. The fourth patterned masking layer covers the first doped region 110. A second doping process (e.g., ion implantation) is then performed to dope the region of the semiconductor pedestal 710 not covered by the fourth patterned masking layer with second doping type dopants (e.g., boron (B), gallium (Ga), etc.), thereby forming the second doped region 112. Subsequently, in some embodiments, the fourth patterned masking layer is stripped away.

It will be appreciated that the second doped region 112 may be formed before the first doped region 110. It will also be appreciated that the first doped region 110 and/or the second doped region 112 may be formed before the semiconductor pedestal 710 is formed. It will further be appreciated that the dielectric layer 1102 may be utilized, at least in part, as the third patterned masking layer and/or the fourth patterned masking layer.

Figure 13B:
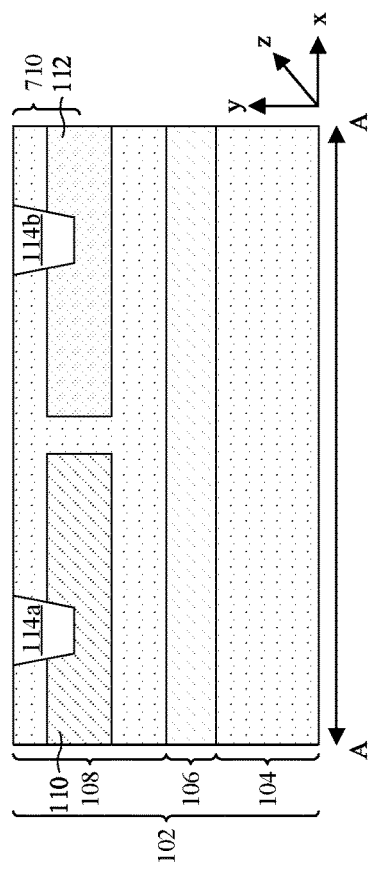
Figure 13C:
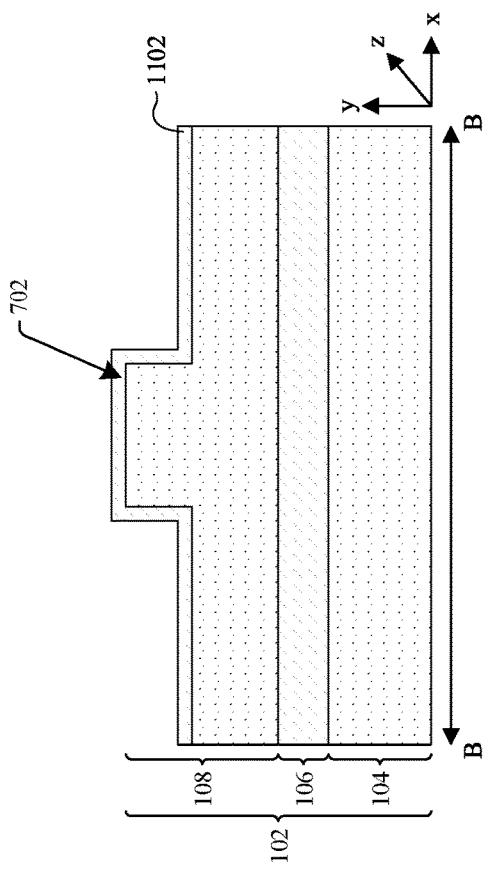
Figure 13A:
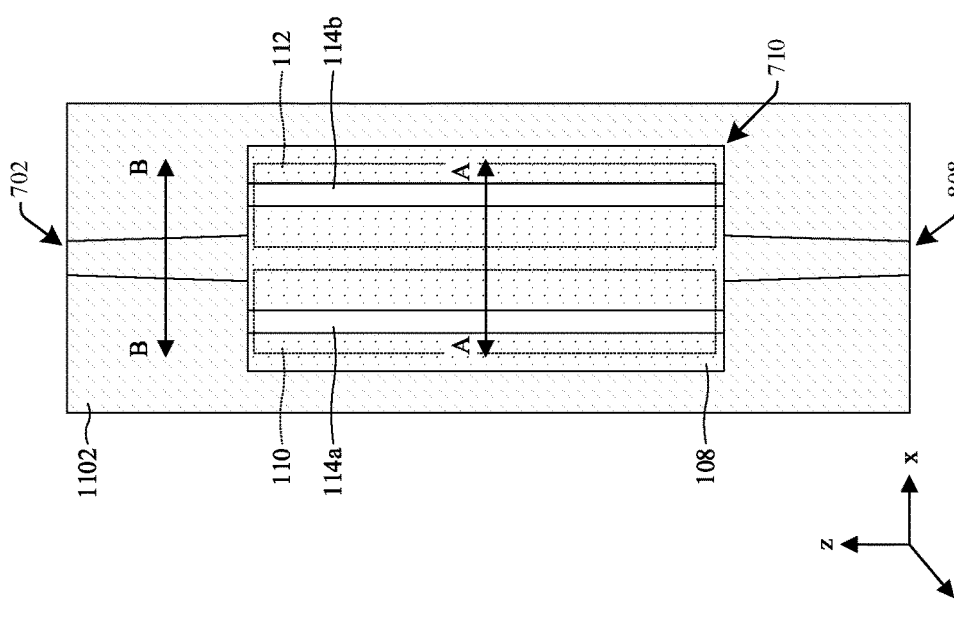

As shown in FIGS. 13A-13C, an isolation structure 114 is formed in the second semiconductor layer 108. In some embodiments, the isolation structure 114 is formed in the semiconductor pedestal 710. The isolation structure 114 partially overlies the first doped region 110 and the second doped region 112. For example, the isolation structure 114 comprises a first portion 114a that overlies the first doped region 110, and the isolation structure 114 comprises a second portion 114b that overlies the second doped region 112. In further embodiments, the first portion 114a of the isolation structure 114 may be formed partially in the first doped region 110. In yet further embodiments, the second portion 114b of the isolation structure 114 may be formed partially in the second doped region 112.

In some embodiments, a process for forming the isolation structure 114 comprises forming a fifth patterned masking layer (not shown) over the semiconductor pedestal 710 and the dielectric layer 1102. Thereafter, an etching process (e.g., wet etch, dry etch, etc.) is performed to remove unmasked portions of the semiconductor pedestal 710, thereby forming trenches in the semiconductor pedestal 710. The trenches are then filled with a dielectric material (e.g., $SiO_2$), thereby forming the isolation structure 114 in the second semiconductor layer 108. In some embodiments, a planarization process (e.g., CMP) may be performed into the dielectric material to planarize an upper surface of the isolation structure 114. It will be appreciated that the isolation structure 114 may be formed before the semiconductor pedestal 710 is formed.

As shown in FIGS. 14A-14C, a third doped region 116 and a fourth doped region 118 are formed in the second semiconductor layer 108. The third doped region 116 is a region of the second semiconductor layer 108 having the first doping type. The third doped region 116 is formed over the first doped region 110 and on a side of the first portion 114a of the isolation structure 114. The third doped region 116 is formed extending vertically to the first doped region 110, such that the first doped region 110 and the third doped region 116 are electrically coupled.

The fourth doped region 118 is a region of the second semiconductor layer 108 having the second doping type. The fourth doped region 118 is formed over the second doped region 112 and on a side of the second portion 114b of the isolation structure 114. The fourth doped region 118 is formed extending vertically to the second doped region 112, such that the second doped region 112 and the fourth doped region 118 are electrically coupled.

In some embodiments, a process for forming the third doped region 116 and the fourth doped region 118 comprises forming a sixth patterned masking layer (not shown) over the semiconductor pedestal 710 and the dielectric layer 1102. Thereafter, a third doping process (e.g., ion implantation) is performed to dope the region of the semiconductor pedestal 710 not covered by the sixth patterned masking layer with first doping type dopants, thereby forming the third doped region 116. The third doping process may dope the region of the semiconductor pedestal 710 not covered by the sixth patterned masking layer with a higher concentration of first doping type dopants than the first doped region 110, such that the third doped region 116 is formed with a higher concentration of first doping type dopants than the first doped region 110. Subsequently, in some embodiments, the sixth patterned masking layer is stripped away.

Thereafter, a seventh patterned masking layer (not shown) is formed over the semiconductor pedestal 710 and the dielectric layer 1102. The seventh patterned masking layer covers the third doped region 116. A fourth doping process (e.g., ion implantation) is then performed to dope the region of the semiconductor pedestal 710 not covered by the seventh patterned masking layer with second doping type dopants, thereby forming the fourth doped region 118. The fourth doping process may dope the region of the semiconductor pedestal 710 not covered by the seventh patterned masking layer with a higher concentration of second doping type dopants than the second doped region 112, such that the fourth doped region 118 is formed with a higher concentration of second doping type dopants than the second doped region 112. Subsequently, in some embodiments, the seventh patterned masking layer is stripped away.

It will be appreciated that the fourth doped region 118 may be formed before the third doped region 116. It will also be appreciated that the third doped region 116 and/or the fourth doped region 118 may be formed before the semiconductor pedestal 710 is formed. It will further be appreciated that the isolation structure 114 may be utilized, at least in part, as the sixth patterned masking layer and/or the seventh patterned masking layer.

Figure 15C:
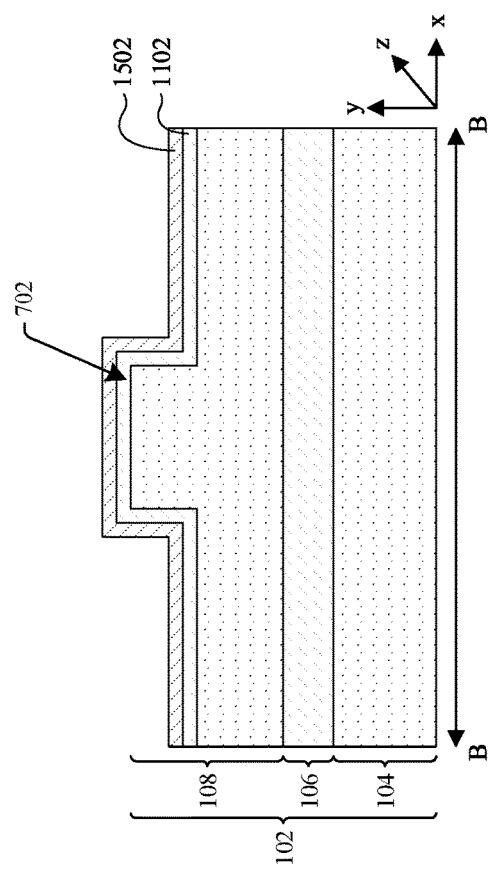
Figure 15B:
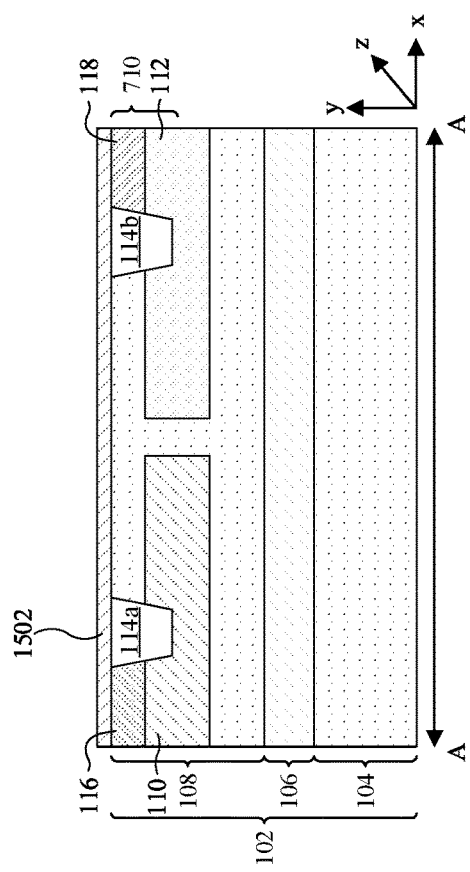
Figure 15A:
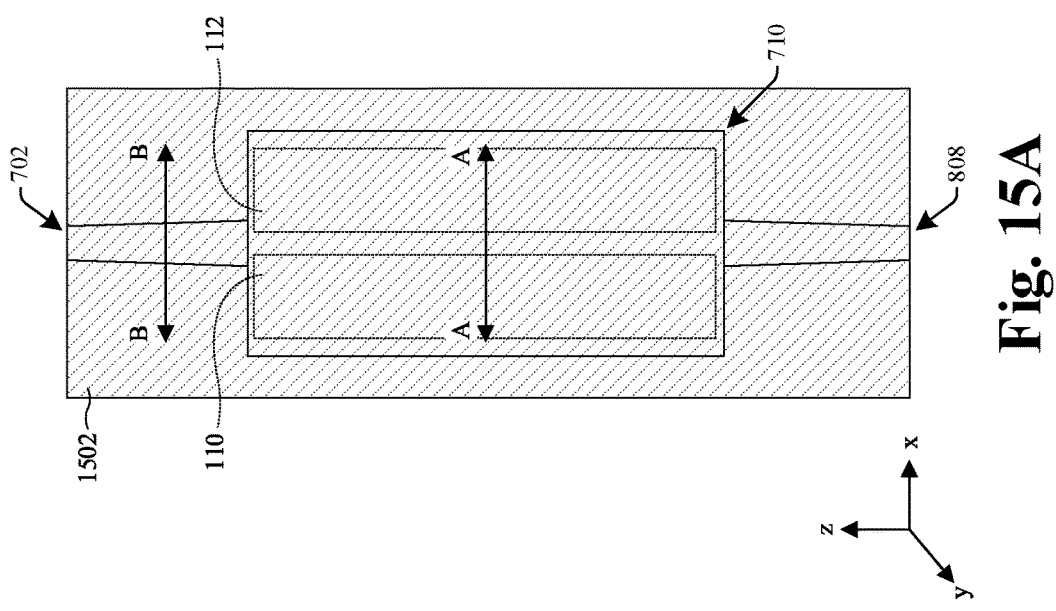

As shown in FIGS. 15A-15C, a masking layer 1502 is formed over the second semiconductor layer 108, the semiconductor pedestal 710, the first waveguide structure 702, the second waveguide structure 808, the isolation structure 114, the third doped region 116, and the fourth doped region 118. The masking layer 1502 covers the semiconductor pedestal 710, the first waveguide structure 702, the second waveguide structure 808, the isolation structure 114, the third doped region 116, and the fourth doped region 118. In some embodiments, the masking layer 1502 is formed over the dielectric layer 1102, as shown in FIGS. 15A-15C. In such embodiments, the masking layer 1502 covers the dielectric layer 1102. In further embodiments, the masking layer 1502 may be formed as a conformal layer. The masking layer 1502 may be or comprise, for example, an oxide (e.g., $SiO_2$), a nitride (e.g., SiN), an oxy-nitride (e.g., silicon oxy-nitride ($SiO_XN_Y$)), some other dielectric material suitable as a masking material, or a combination of the foregoing.

In some embodiments, a process for forming the masking layer 1502 comprises depositing the masking layer 1502 over the second semiconductor layer 108, the semiconductor pedestal 710, the first waveguide structure 702, the second waveguide structure 808, the dielectric layer 1102, the isolation structure 114, the third doped region 116, and the fourth doped region 118. The masking layer 1502 may be deposited by, for example, CVD, PVD, ALD, some other deposition process, or a combination of the foregoing. It will be appreciated that, in some embodiments, the dielectric layer 1102 may stripped away before the masking layer 1502 is formed. In such embodiments, rather than the dielectric layer 1102 separating the masking layer 1502 from some portions of the second semiconductor layer 108, the masking layer 1502 may be formed on the some portions of the second semiconductor layer 108.

Figure 16B:
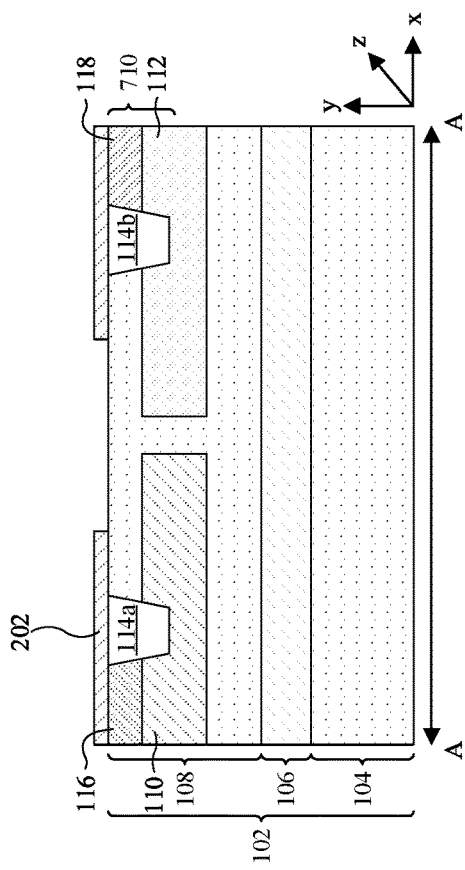
Figure 16C:
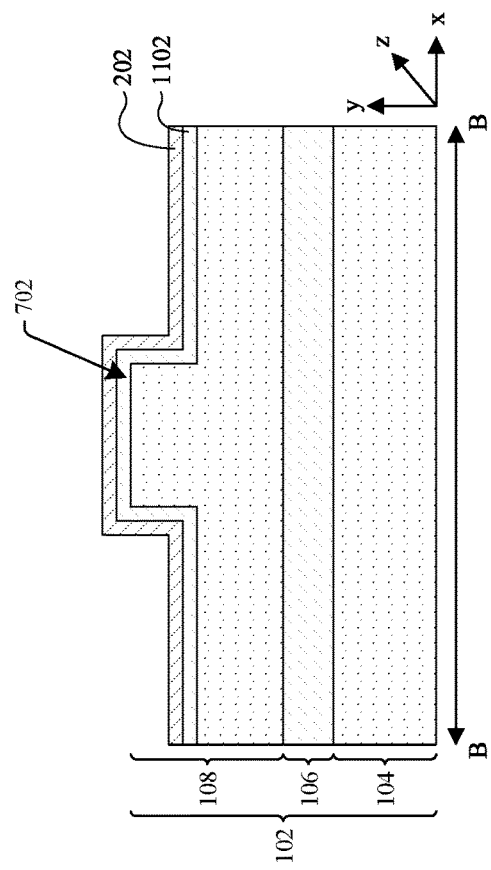
Figure 16A:
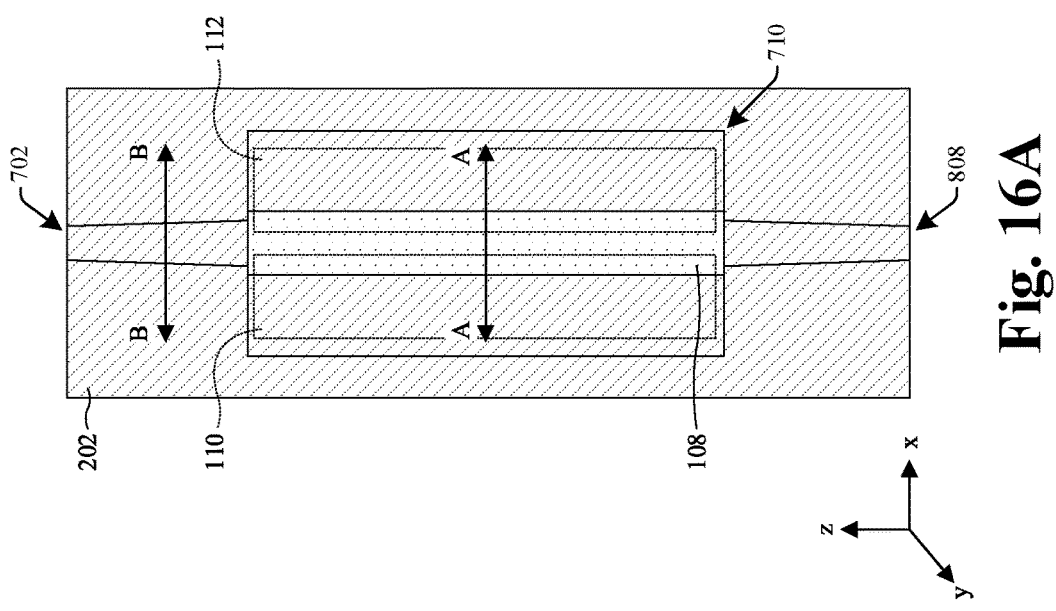

As shown in FIGS. 16A-16C, a masking structure 202 is formed over the second semiconductor layer 108, the semiconductor pedestal 710, the first waveguide structure 702, the second waveguide structure 808, the isolation structure 114, the third doped region 116, and the fourth doped region 118. The masking structure 202 is a portion of the masking layer 1502 (see, FIGS. 15A-15C). In some embodiments, the masking structure 202 covers the first waveguide structure 702, the second waveguide structure 808, the isolation structure 114, the third doped region 116, and the fourth doped region 118. In further embodiments, the masking structure 202 is formed over the dielectric layer 1102, as shown in FIGS. 16A-16C. In such embodiments, the masking structure 202 covers the dielectric layer 1102.

The masking structure 202 partially covers the semiconductor pedestal 710. The masking structure 202 exposes a region of the semiconductor pedestal 710 that is disposed between the first portion 114a of the isolation structure 114 and the second portion 114b of the isolation structure 114. In some embodiments, a process for forming the masking structure 202 comprises forming an eighth patterned masking layer (not shown) over the masking layer 1502. Thereafter, a third etching process is performed to remove unmasked portions of the masking layer 1502, thereby forming the masking structure 202. The third etching process may be a dry etching process, a wet etching process, a RIE process, some other etching process, or a combination of the foregoing. Subsequently, in some embodiments, the eighth patterned masking layer is stripped away.

As shown in FIGS. 17A-17C, an opening 1702 is formed in the second semiconductor layer 108. In some embodiments, the opening 1702 is formed in the semiconductor pedestal 710, as shown in FIGS. 17A-17C. The opening 1702 has a ninth sidewall 1704 and a tenth sidewall 1706. The ninth sidewall 1704 is opposite the tenth sidewall 1706. The opening 1702 has a first lower surface 1708 that extends from the ninth sidewall 1704 to the tenth sidewall 1706. In some embodiments, the ninth sidewall 1704 and the tenth sidewall 1706 are substantially vertical. In further embodiments, the first lower surface 1708 is substantially planar.

The opening 1702 is at least partially defined by the second semiconductor layer 108. For example, the ninth sidewall 1704 and the tenth sidewall 1706 are defined by sidewalls of the second semiconductor layer 108, respectively, and the first lower surface 1708 of the opening 1702 is defined by a first upper surface of the second semiconductor layer 108. The first lower surface 1708 is disposed between the insulating layer 106 and a second upper surface of the second semiconductor layer 108. In some embodiments, the second upper surface of the second semiconductor layer 108 corresponds to an uppermost surface of the semiconductor pedestal 710.

In some embodiments, a process for forming the opening 1702 comprises performing a fourth etching process 1710 with the masking structure 202 partially covering the semiconductor pedestal 710. The fourth etching process 1710 removes the portion of the second semiconductor layer 108 that is not masked by the masking structure 202. In some embodiments, the fourth etching process 1710 is a highly directional etch that etches the second semiconductor layer 108 vertically (e.g., downward) with little to no lateral (e.g., sideways) etching of the second semiconductor layer 108. In some embodiments, the fourth etching process 1710 is a dry etching process, a RIE process, some other anisotropic etching process, or a combination of the foregoing. In further embodiments, the surfaces of the opening 1702 that are formed by the fourth etching process 1710 (e.g., the ninth sidewall 1704, the tenth sidewall 1706, the first lower surface 1708, etc.) may be referred to as initial surfaces of the opening 1702.

As shown in FIGS. 18A-18C, a fifth etching process 1802 is performed to round the initial surfaces of the opening 1702. For clarity, the ninth sidewall 1704, the tenth sidewall 1706, and the first lower surface 1708 of the opening 1702 are illustrated by a dotted line in FIG. 18B. The fifth etching process 1802 rounds the surfaces of the opening 1702, such that the opening has an eleventh sidewall 1804, a twelfth sidewall 1806, and a second lower surface 1808 after the fifth etching process 1802. The fifth etching process 1802 may be referred to as a first rounding etch process due to the fifth etching process 1802 rounding the initial surfaces of the opening 1702.

The second lower surface 1808 arcs between the eleventh sidewall 1804 and the twelfth sidewall 1806. In some embodiments, the second lower surface 1808 arcs continuously from the eleventh sidewall 1804 to the twelfth sidewall 1806. In further embodiments, the eleventh sidewall 1804 and the twelfth sidewall 1806 may be substantially vertical. In other embodiments, the eleventh sidewall 1804 and the twelfth sidewall 1806 may arc from the second lower surface 1808 to the second upper surface of the second semiconductor layer 108. In yet other embodiments, the eleventh sidewall 1804 and the twelfth sidewall 1806 may angle away from one another as they extend vertically from the second lower surface 1808 to the second upper surface of the second semiconductor layer 108.

In some embodiments, the fifth etching process 1802 increases the height of the opening 1702. In other words, a lowermost point of the second lower surface 1808 is disposed deeper in the second semiconductor layer 108 than a lowermost point of the first lower surface 1708. In further embodiments, the fifth etching process 1802 increases a width of the opening 1702. In other words, the eleventh sidewall 1804 and the twelfth sidewall 1806 are laterally spaced a greater distance apart than the ninth sidewall 1704 and the tenth sidewall 1706. In yet further embodiments, the fifth etching process 1802 may laterally etch the second semiconductor layer 108 at a faster rate than the masking structure 202. In such embodiments, the masking structure 202 may overhang the opening 1702.

The fifth etching process 1802 is a dry etching process (e.g., plasma etching). In some embodiments, the fifth etching process 1802 is a chemical dry etching (CDE) process (e.g., etching occurs through purely chemical interactions). In further embodiments, the fifth etching process 1802 may comprise exposing the second semiconductor layer 108 to an etchant gas (e.g., a gas composition comprising, for example, tetrafluoromethane ($CF_4$), oxygen ($O_2$), nitrogen ($N_2$), chlorine ($Cl_2$), etc.). The fifth etching process 1802 may be an isotropic etching process.

The fifth etching process 1802 is different than the fourth etching process 1710 (see, FIGS. 17A-17C). In some embodiments, the fifth etching process 1802 and the fourth etching process 1710 may be different due to the phenomena in which the fourth etching process 1710 and the fifth etching process 1802 etch a target material (e.g., physical, chemical, or physical-chemical etch). For example, in some embodiments, the fourth etching process 1710 is a RIE process (e.g., physical-chemical etch), and the fifth etching process 1802 is a CDE process (e.g., chemical etch). The fifth etching process 1802 may also be different than the fourth etching process 1710 due to differences in the directionality of the fifth etching process 1802 compared to the fourth etching process 1710. For example, a ratio of the vertical etch rate to the lateral etch rate of the second semiconductor layer 108 for the fourth etching process 1710 is greater than the vertical etch rate to the lateral etch rate of the second semiconductor layer 108 for the fifth etching process 1802. The fifth etching process 1802 may also be different than the fourth etching process 1710 due to difference in etching conditions (e.g., different etchant compositions, different pressures, different flow rates, etc.).

As shown in FIGS. 19A-19C, portions of the masking structure 202 that overhang the opening 1702 are removed. In some embodiments, a process for removing the portions of the masking structure 202 that overhang the opening 1702 comprises performing a cleaning process 1902 on the structure illustrated in FIGS. 18A-18C. The cleaning process 1902 selectively removes the portions of the masking structure 202 that overhang the opening 1702. For clarity, the portions of the masking structure 202 that are selectively removed by the cleaning process 1902 are illustrated by a dotted line in FIG. 19B. In some embodiments, the cleaning process 1902 comprises dipping the structure illustrated in FIGS. 18A-1C in a dilute hydrofluoric acid (DHF) solution. In further embodiments, the cleaning process 1902 may remove additional portions of the masking structure 202 that do not overhang the opening 1702, but are adjacent to the portions of the masking structure 202 that overhang the opening 1702, such that the eleventh sidewall 1804 and the twelfth sidewall 1806 are both disposed between opposite inner sidewalls of the masking structure 202.

Figure 20B:
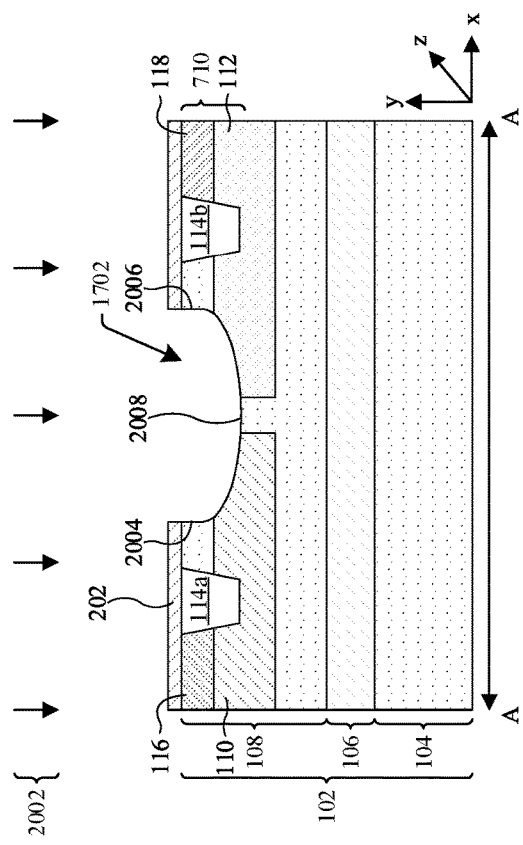
Figure 20C:
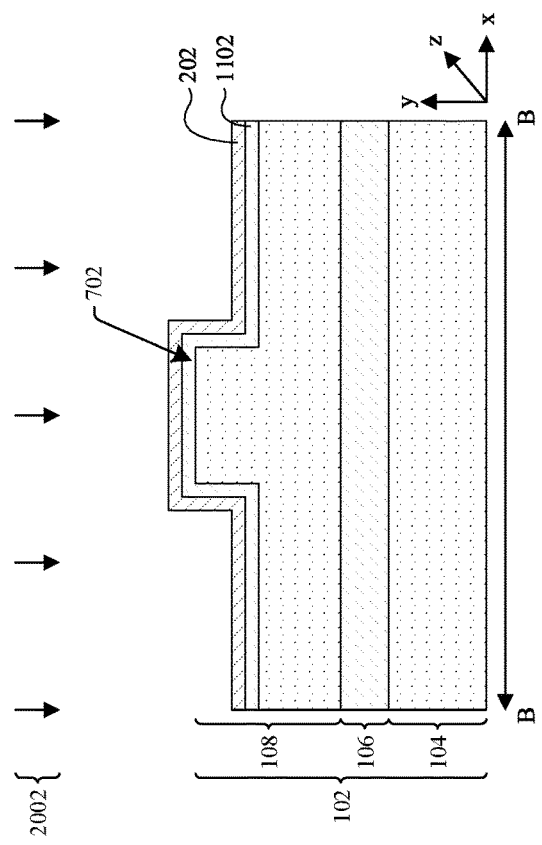
Figure 20A:
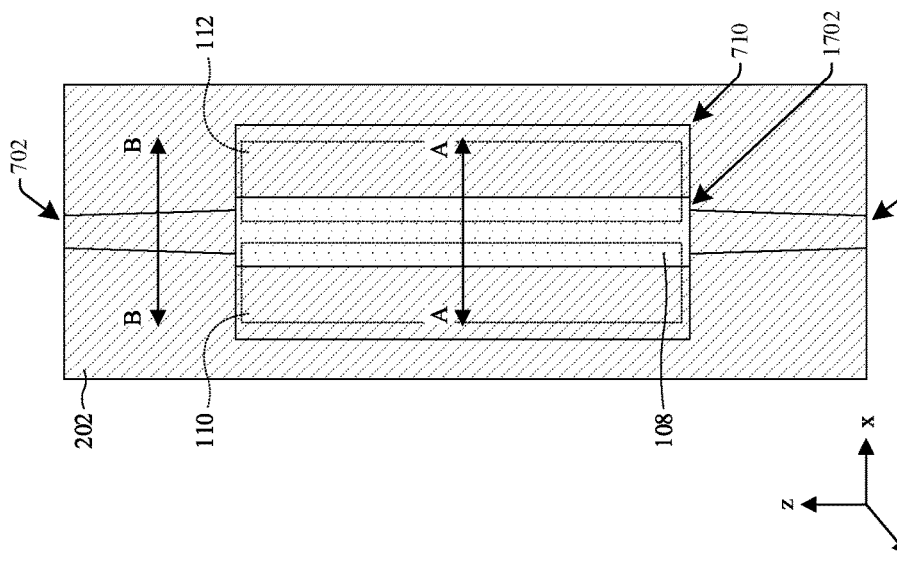

As shown in FIGS. 20A-20C, a sixth etching process 2002 is performed to further round the surfaces of the opening 1702. The sixth etching process 2002 rounds the eleventh sidewall 1804, the twelfth sidewall 1806, and/or the second lower surface 1808 (see, FIGS. 18A-18C), such that the opening 1702 has a thirteenth sidewall 2004, a fourteenth sidewall 2006, and a third lower surface 2008 after the sixth etching process 2002. For example, the second lower surface 1808, the eleventh sidewall 1804, and/or the twelfth sidewall 1806 may have some linear portions that are rounded by the sixth etching process 2002. In some embodiments, the surfaces of the opening 1702 rounded by the fifth etching process 1802 (see, FIGS. 18A-18C) may be referred to as first rounded surfaces of the opening 1702, and the surfaces of the opening 1702 rounded by the sixth etching process 2002 may be referred to as second rounded surfaces of the opening 1702. In other words, the fourth etching process 1710 forms initial surfaces of the opening 1702, the fifth etching process 1802 rounds the initial surfaces into the first rounded surfaces of the opening 1702, and the sixth etching process 2002 rounds the first rounded surfaces into the second rounded surfaces of the opening 1702. In further embodiments, the sixth etching process 2002 is referred to as a second rounding etch process due to the sixth etching process 2002 further rounding the surfaces of the first rounded surfaces of the opening 1702.

The third lower surface 2008 arcs between the thirteenth sidewall 2004 and the fourteenth sidewall 2006. In some embodiments, the third lower surface 2008 arcs continuously from the thirteenth sidewall 2004 to the fourteenth sidewall 2006. In further embodiments, the thirteenth sidewall 2004 and the fourteenth sidewall 2006 may be substantially vertical. In other embodiments, the thirteenth sidewall 2004 and the fourteenth sidewall 2006 may arc from the third lower surface 2008 to the second upper surface of the second semiconductor layer 108.

In some embodiments, the sixth etching process 2002 further increases the height of the opening 1702. In other words, a lowermost point of the third lower surface 2008 is disposed deeper in the second semiconductor layer 108 than the lowermost point of the second lower surface 1808. In further embodiments, the sixth etching process 2002 further increases a width of the opening 1702. In other words, the thirteenth sidewall 2004 and the fourteenth sidewall 2006 are laterally spaced a greater distance apart than the eleventh sidewall 1804 and the twelfth sidewall 1806.

The sixth etching process 2002 may remove portions of the masking structure 202, such that opposite inner sidewalls of the masking structure 202 are substantially aligned with the thirteenth sidewall 2004 and the fourteenth sidewall 2006, respectively, as shown in FIGS. 20A-20C. In some embodiments, the sixth etching process 2002 may laterally etch the second semiconductor layer 108 at a faster rate than the masking structure 202. In such embodiments, the masking structure 202 may overhang the opening 1702 after the sixth etching process 2002 (see, e.g., FIGS. 5-6). In other such embodiments, the opposite inner sidewalls of the masking structure 202 may be substantially aligned with the thirteenth sidewall 2004 and the fourteenth sidewall 2006, respectively. For example, after the cleaning process 1902 (see, FIGS. 19A-19C), both the eleventh sidewall 1804 and the twelfth sidewall 1806 may be disposed between opposite inner sidewalls of the masking structure 202. The sixth etching process 2002 may then laterally etch the second semiconductor layer 108 at a faster rate than the masking structure 202, thereby substantially aligning the opposite inner sidewalls of the masking structure 202 with the thirteenth sidewall 2004 and the fourteenth sidewall 2006, respectively.

The sixth etching process is a dry etching process (e.g., a hydrogen chloride (HCl) vapor phase etch). In some embodiments, the sixth etching process 2002 comprises baking the semiconductor substrate 102 at a predefined temperature in a processing chamber that has an ambient environment comprising chloride (Cl). More specifically, in some embodiments, the ambient environment comprises HCl gas. In some embodiments, the predefined temperature is less than about 1200 degrees Celsius (° C.). More specifically, the predefined temperature is between about 700°
C. and about 800° C. By baking the semiconductor substrate 102 in the processing chamber, the sixth etching process 2002 further rounds the surfaces of the opening 1702 (e.g., due to the Cl etching the second semiconductor layer 108 at the predefined temperature).

In addition to the sixth etching process 2002 further rounding the surfaces of the opening 1702, the sixth etching process 2002 may improve the surfaces of the second semiconductor layer 108 that define the opening 1702 (e.g., the improved surfaces may be cleaner (e.g., reduced number of surface contaminates, such as surface oxides) and/or smoother (e.g., reduced surface roughness)). For example, after the sixth etching process 2002, the opening 1702 is defined by the thirteenth sidewall 2004, the fourteenth sidewall 2006, and the third lower surface 2008. The thirteenth sidewall 2004, the fourteenth sidewall 2006, and the third lower surface 2008 may be improved over the eleventh sidewall 1804, the twelfth sidewall 1806, and the second lower surface 1808 (e.g., due to the sixth etching process 2002 forming cleaner and/or smoother surfaces than the fifth etching process 1802). The improved surfaces of the opening 1702 allow a higher quality epitaxial structure to be formed in the opening 1702 (e.g., due to the improved surfaces being cleaner and/or smoother).

The sixth etching process 2002 may be an isotropic etching process. In some embodiments, the sixth etching process 2002 is different than the fifth etching process 1802. For example, the sixth etching process 2002 may utilize a different etchant gas than the fifth etching process 1802 (e.g., the sixth etching process may utilize HCl as an etchant gas while the fifth etching process 1802 may utilize $CF_4$). It will be appreciated that the sixth etching process 2002 may also be different than the fifth etching process 1802 due to other differences in etching conditions (e.g., different pressures, different flow rates, etc.).

In some embodiments, the sixth etching process 2002 may round the opposite inner sidewalls of the masking structure 202 (see, e.g., FIGS. 3-4). In other embodiments, the sixth etching process 2002 may etch the masking structure 202, such that the opposite inner sidewalls of the masking structure 202 are substantially vertical, as shown in FIGS. 20A-20C. In further embodiments, the fifth etching process 1802 and/or the cleaning process 1902 may round the opposite inner sidewalls of the masking structure 202. In other embodiments, the fifth etching process 1802 and/or the cleaning process 1902 may etch the masking structure 202, such that the opposite inner sidewalls of the masking structure 202 are substantially vertical, as shown in FIGS. 18A-18C through 19A-19C.

Figure 21B:
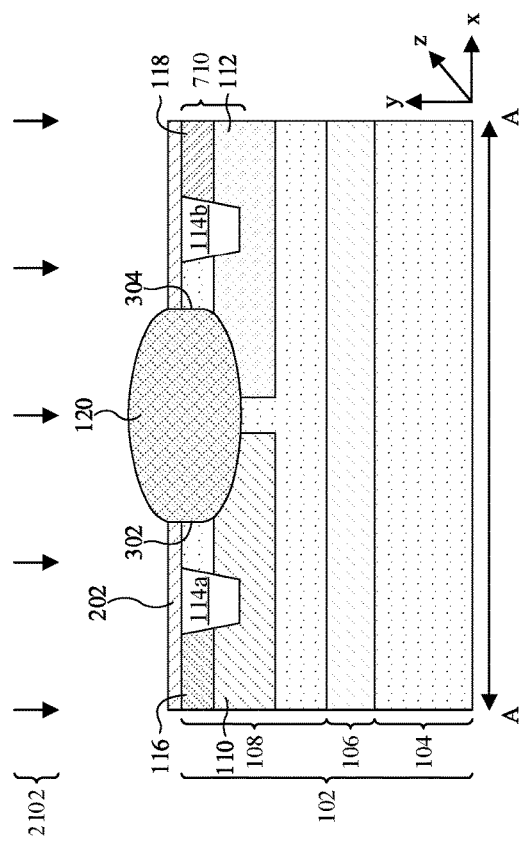
Figure 21C:
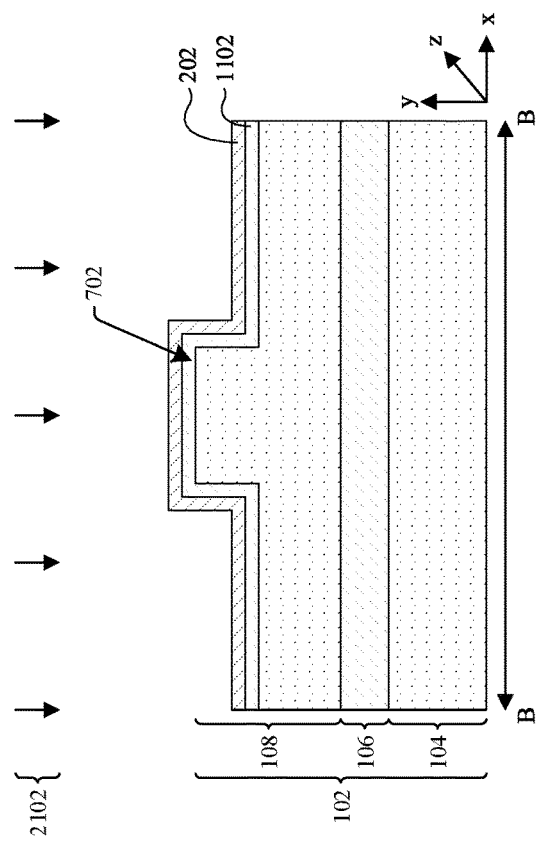
Figure 21A:
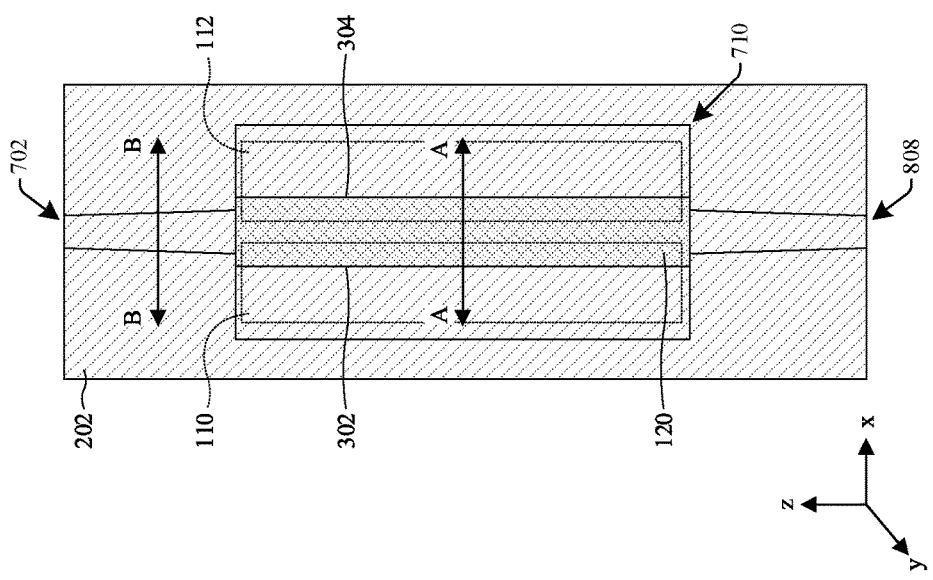

As shown in FIGS. 21A-21C, a photodetector 120 is formed in the opening 1702 (see, FIGS. 20A-20C). The photodetector 120 is or comprises a semiconductor material. The photodetector 120 is formed extending vertically out of the opening 1702, such that the photodetector 120 is at least partially disposed over the second upper surface of the second semiconductor layer 108 (e.g., the uppermost surface of the semiconductor pedestal 710) and an upper surface of the masking structure 202.

The photodetector 120 is formed with a first sidewall 302 and a second sidewall 304 opposite the first sidewall 302. The first sidewall 302 corresponds to the thirteenth sidewall 2004 (see, FIGS. 20A-20C). The second sidewall 304 corresponds to the fourteenth sidewall 2006 (see, FIGS. 20A-20C). The photodetector 120 is formed with a lower surface that arcs from the first sidewall 302 to the second sidewall 304. The lower surface of the photodetector 120 corresponds to the third lower surface 2008 (see, FIGS. 20A-20C). In some embodiments, the photodetector 120 is formed with an upper surface that arcs from the first sidewall 302 to the second sidewall 304. Because the lower surface of the photodetector 120 is formed arcing from the first sidewall 302 to the second sidewall 304, the photodetector 120 may have improved (e.g., decreased) dark current.

In some embodiments, a process for forming the photodetector 120 comprises performing an epitaxial process 2102 to grow the photodetector 120 from the opening 1702 (see, FIGS. 20A-20C). The epitaxial process 2102 comprises growing a semiconductor material (e.g., Ge) from the second semiconductor layer, thereby forming the photodetector 120. The semiconductor material grown by the epitaxial process 2102 is different than the semiconductor material of the second semiconductor layer 108. The epitaxial process 2102 may be, for example, vapor-phase epitaxy (VPE), molecular-beam epitaxy (MBE), liquid-phase epitaxy (LPE), solid-phase epitaxy (SPE), reduced pressure chemical vapor deposition (RP-CVD) epitaxy, metalorganic vapor phase epitaxy (MOVPE), some other epitaxial process, or a combination of the foregoing.

The epitaxial process 2102 is performed in a processing chamber. In some embodiments, the sixth etching process 2002 (see, FIGS. 20A-20C) and the epitaxial process 2102 are performed in the same processing chamber. In such embodiments, the sixth etching process 2002 may be an in-situ etching process. It will be appreciated that, in some embodiments, a doped region (e.g., the fifth doped region 902) may be formed in the photodetector 120 (e.g., via ion implantation).

Figure 22B:
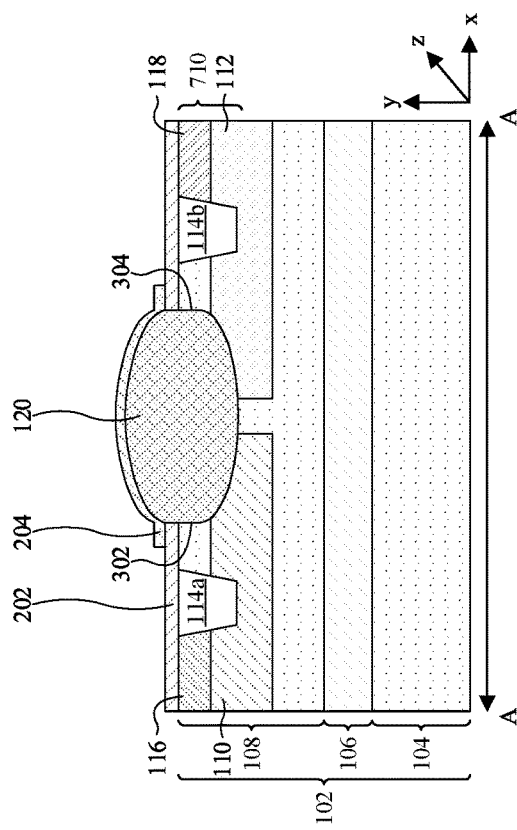
Figure 22C:
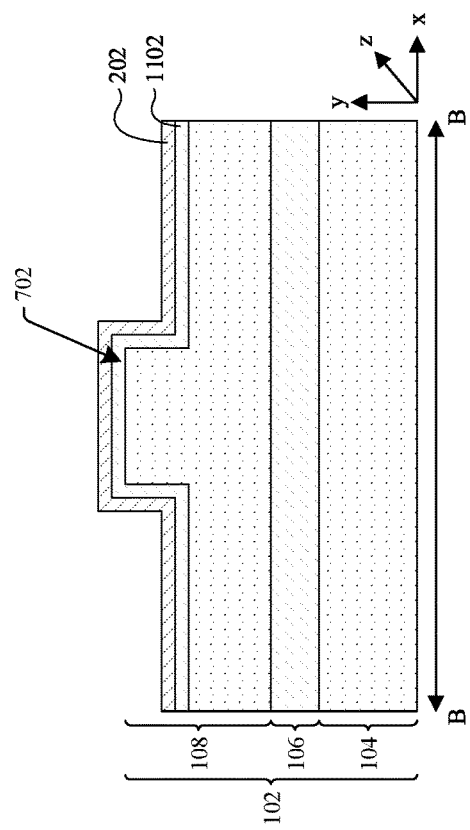
Figure 22A:
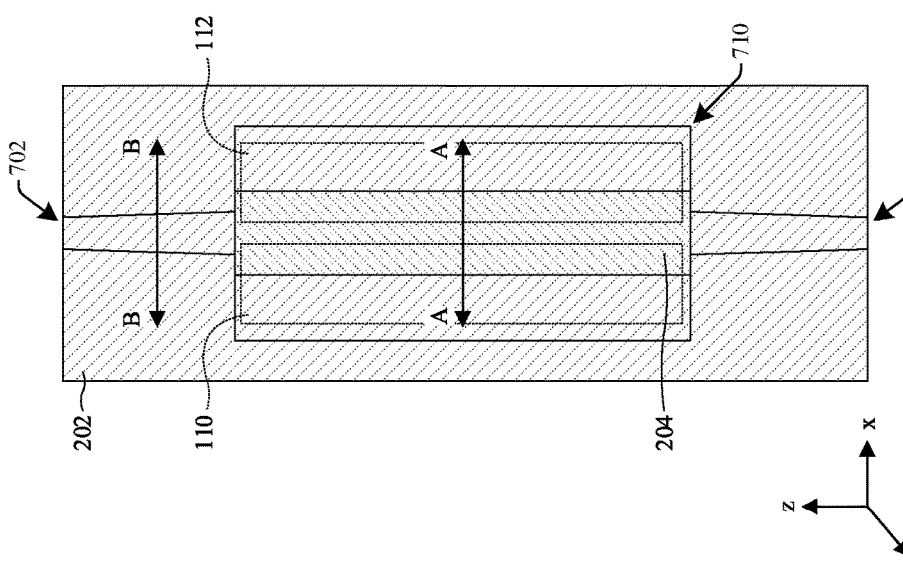

As shown in FIGS. 22A-22B, a capping structure 204 is formed over the photodetector 120 and the masking structure 202. The capping structure 204 is formed covering the photodetector 120. In some embodiments, the capping structure 204 is formed at least partially covering the masking structure 202. In further embodiments, the capping structure 204 is formed as a conformal layer.

In some embodiments, a process for forming the capping structure 204 comprises depositing of growing the capping layer (not shown) over the photodetector 120 and the masking structure 202. The capping layer may be or comprise, for example, a nitride (e.g., SiN), a semiconductor material (e.g., Si, SiGe, or the like), an oxide (e.g., SiO$_2$), or the like. The capping layer may be deposited or grown by, for example, CVD, PVD, ALD, an epitaxial process, or the like. Thereafter, a ninth patterned masking layer (not shown) is formed over the capping layer. A seventh etching process is then performed to remove unmasked portions of the capping layer, thereby forming the capping structure 204. The seventh etching process may be a dry etching process, a wet etching process, a RIE process, some other etching process, or a combination of the foregoing. Subsequently, in some embodiments, the ninth patterned masking layer is stripped away.

Figure 23C:
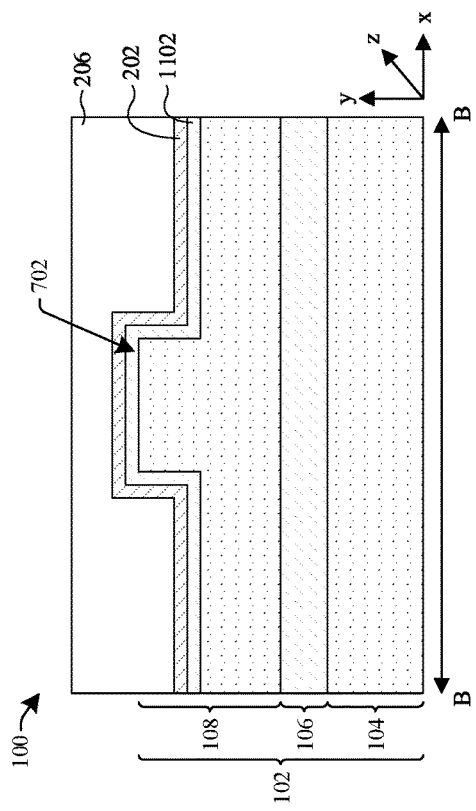
Figure 23B:
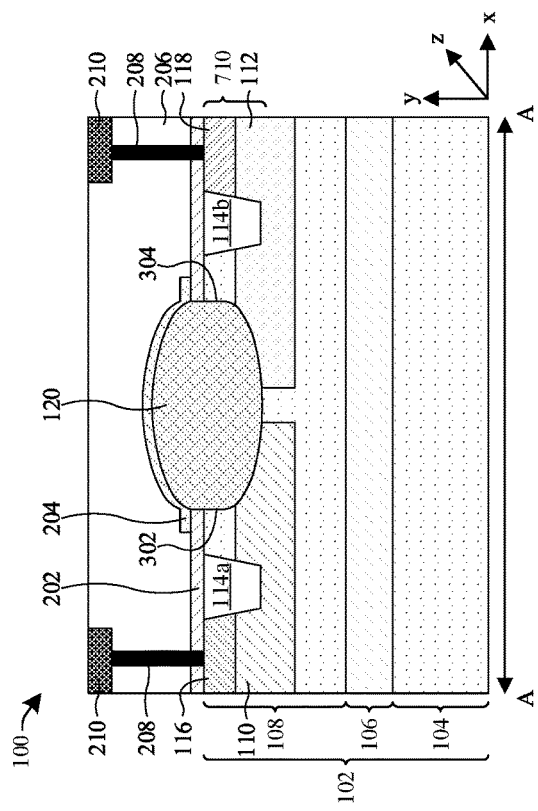
Figure 23A:
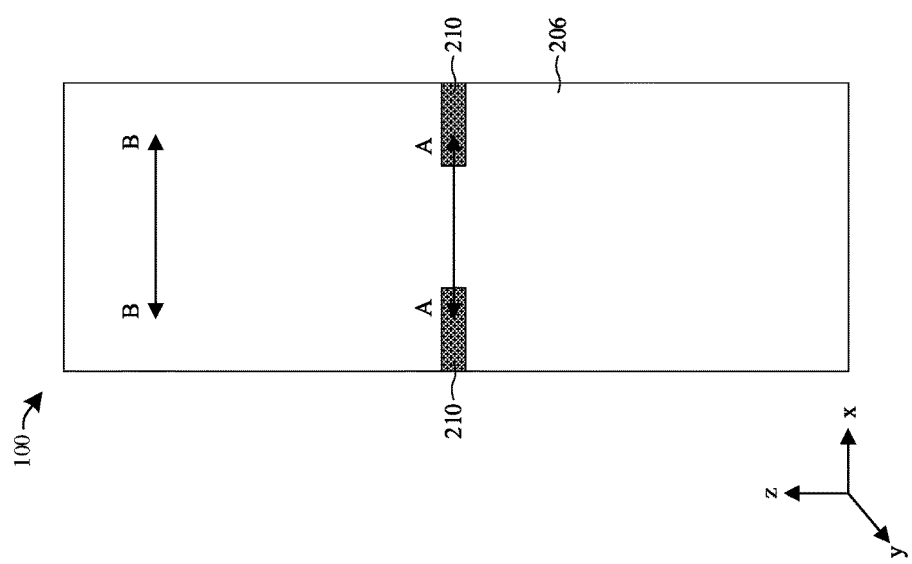

As shown in FIGS. 23A-23C, an ILD structure 206 is formed over the semiconductor substrate 102, the isolation structure 114, the photodetector 120, the masking structure 202, and the capping structure 204. The ILD structure 206 comprises one or more stacked ILD layers. Also shown in FIGS. 23A-23C, a plurality of conductive contacts 208 and a plurality of conductive lines 210 are formed in the ILD structure 206. The conductive contacts 208 are formed extending vertically from the semiconductor substrate 102. The conductive lines 210 are formed over and electrically coupled to the conductive contacts 208. The conductive contacts 208 and the conductive lines 210 are part of an interconnect structure that is embedded in the ILD structure 206.

In some embodiments, a process for forming the ILD structure 206, the conductive contacts 208, and the conductive lines 210 comprises forming a first ILD layer over the semiconductor substrate 102, the isolation structure 114, the photodetector 120, the masking structure 202, and the capping structure 204. Thereafter, contact openings are formed in the first ILD layer. A conductive material (e.g., W) is then formed on the first ILD layer and the in the contact openings. Thereafter, a planarization process (e.g., CMP) is performed into the conductive material to form the conductive contacts 208 in the first ILD layer.

A second ILD layer is then formed over the first ILD layer and the conductive contacts 208. A plurality of trenches are then formed in the second ILD layer. A conductive material (e.g., Cu) is formed on the second ILD layer and in the trenches. Thereafter, a planarization process (e.g., CMP) is performed into the conductive material to form the conductive lines 210. Although not shown, it will be appreciated that any number of other conductive features (e.g., conductive lines and conductive vias) and ILD layers may be formed over the semiconductor substrate 102, the isolation structure 114, the photodetector 120, the masking structure 202, and the capping structure 204, thereby forming the ILD structure 206 with the interconnect structure embedded in therein.

It will be appreciated that bond pads (not shown) (e.g., Cu pads) may be formed in the ILD structure 206 and electrically coupled to the conductive lines 210. It will further be appreciated that, in some embodiments, formation of the bond pads may complete formation of the semiconductor device 100. It will also be appreciated that, in some embodiments, the bond pads of the semiconductor device 100 may be bonded (e.g., via fusion bonding, eutectic boning, etc.) to bond pads of a separate semiconductor die/wafer (e.g., a complementary metal-oxide-semiconductor (CMOS) die comprising IC devices for processing signals from the semiconductor device 100).

Figure 24:
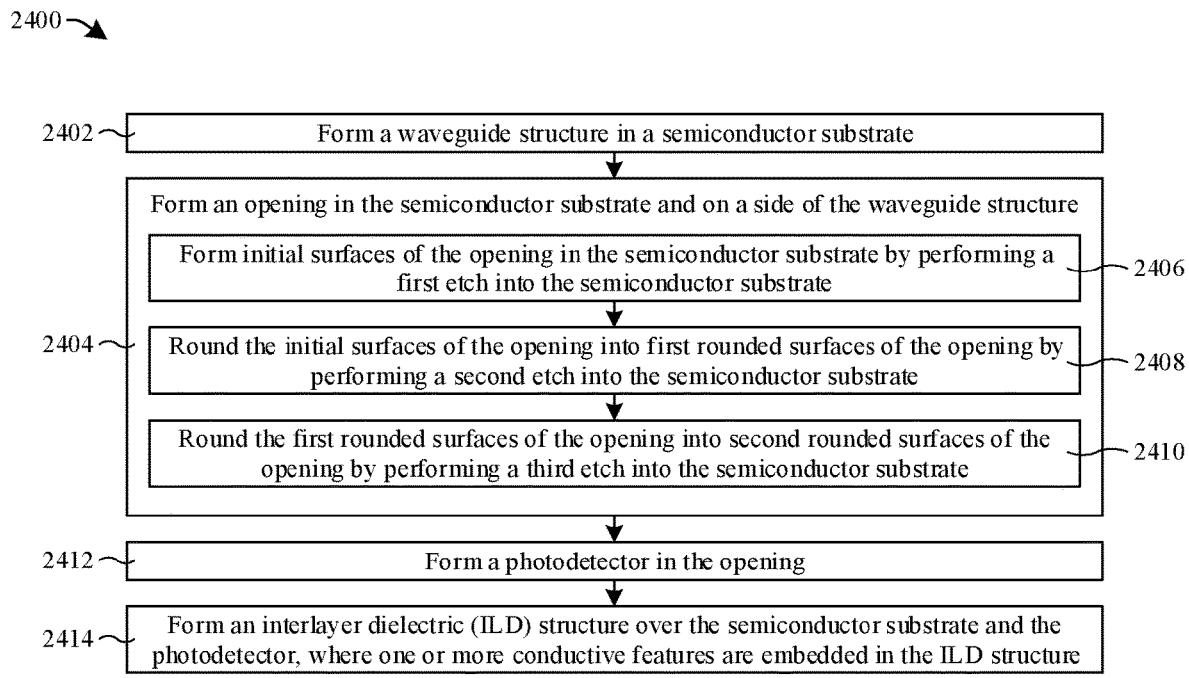
FIG. 24 illustrates a flowchart of some embodiments of a method for forming a semiconductor device comprising a photodetector with reduced dark current.

FIG. 24 illustrates a flowchart of some embodiments of a method for forming a semiconductor device comprising a photodetector with reduced dark current. While the flowchart 2400 of FIG. 24 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 2402, a waveguide structure is formed in a semiconductor substrate. FIGS. 10A-10C illustrates various views of some embodiments corresponding to act 2402.

At act 2404, an opening is formed in the semiconductor substrate and on a side of the waveguide structure. Act 2404 comprises acts 2406, 2408, and 2410. FIGS. 11A-11C through 20A-20C illustrate a series of various views of some embodiments corresponding to act 2404.

At act 2406, initial surfaces of the opening are formed in the semiconductor substrate by performing a first etch into the semiconductor substrate. FIGS. 17A-17C illustrates various views of some embodiments corresponding to act 2406.

At act 2408, the initial surfaces of the opening are rounded into first rounded surfaces of the opening by performing a second etch into the semiconductor substrate. FIGS. 18A-18C illustrates various views of some embodiments corresponding to act 2408.

At act 2410, the first rounded surfaces of the opening are rounded into second rounded surfaces of the opening by performing a third etch into the semiconductor substrate. FIGS. 20A-20C illustrates various views of some embodiments corresponding to act 2410.

At act 2412, a photodetector is formed in the opening. FIGS. 21A-21C illustrates various views of some embodiments corresponding to act 2412.

At act 2414, an interlayer dielectric (ILD) structure is formed over the semiconductor substrate and the photodetector, where one or more conductive features are embedded in the ILD structure. FIGS. 22A-22C through 23A-23C illustrate a series of various views of some embodiments corresponding to act 2414.

In some embodiments, the present application provides a semiconductor device. The semiconductor device comprises a first doped region having a first doping type disposed in a semiconductor substrate. A second doped region having a second doping type different than the first doping type is disposed in the semiconductor substrate, wherein the first doped region and the second doped region are laterally spaced. A waveguide structure is disposed in the semiconductor substrate and laterally between the first doped region and the second doped region. A photodetector is disposed at least partially in the semiconductor substrate and laterally between the first doped region and the second doped region. The waveguide structure is configured to guide one or more photons into the photodetector. The photodetector has an upper surface that continuously arcs between opposite sidewalls of the photodetector. The photodetector has a lower surface that continuously arcs between the opposite sidewalls of the photodetector.

In some embodiments, the present application provides a semiconductor device. The semiconductor device comprises a semiconductor substrate comprising a first semiconductor layer, an insulating layer, and a second semiconductor layer. The insulating layer vertically separates the first semiconductor layer from the second semiconductor layer. The second semiconductor layer comprises silicon. A waveguide structure is disposed in the second semiconductor layer, wherein the waveguide structure is defined by a portion of the second semiconductor layer. A photodetector is disposed at least partially in the second semiconductor layer and on a side of the waveguide structure. The waveguide structure is configured to guide one or more photons into the photodetector. The photodetector comprises germanium. A height of the photodetector continuously decreases from a centerline of the photodetector to a first sidewall of the photodetector, and the height of the photodetector continuously decreases from the centerline of the photodetector to a second sidewall of the photodetector that is opposite the first sidewall of the photodetector.

In some embodiments, the present application provides a method for forming a semiconductor device. The method comprises receiving a semiconductor substrate comprising a first semiconductor layer, an insulating layer, and a second semiconductor layer, wherein the insulating layer vertically separates the first semiconductor layer from the second semiconductor layer, and wherein the second semiconductor layer comprises silicon. A waveguide structure is formed in the second semiconductor layer. An opening is formed in the second semiconductor layer via a first etch, wherein the opening has a first lower surface that is substantially planar, and wherein the opening is disposed on a side of the waveguide structure. The first lower surface is rounded into a second lower surface of the opening via a second etch, wherein the second etch is a chemical dry etch (CDE). After the first lower surface is rounded into the second lower surface, the second lower surface is rounded into a third lower surface of the opening via a third etch, wherein the third etch comprises baking the semiconductor substrate in an ambient environment comprising chloride. After the third etch, a germanium photodetector is formed in the opening, wherein the germanium photodetector is formed by an epitaxial process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first doped region having a first doping type disposed in a semiconductor substrate;
   a second doped region having a second doping type different than the first doping type disposed in the semiconductor substrate, wherein the first doped region and the second doped region are laterally spaced;
   a waveguide structure disposed in the semiconductor substrate and laterally between the first doped region and the second doped region; and
   a photodetector disposed at least partially in the semiconductor substrate and laterally between the first doped region and the second doped region, wherein:
   the waveguide structure is configured to guide one or more photons into the photodetector;
   the photodetector has an upper surface that continuously arcs between opposite sidewalls of the photodetector; and
   the photodetector has a lower surface that continuously arcs between the opposite sidewalls, wherein the continuous arc of the lower surface reduces a dark current within the photodetector.

2. The semiconductor device of claim 1, wherein the waveguide structure comprises silicon and the photodetector comprises germanium.

3. The semiconductor device of claim 2, wherein a height of the photodetector continuously decreases from a centerline of the photodetector to each of the opposite sidewalls of the photodetector.

4. The semiconductor device of claim 3, wherein the opposite sidewalls of the photodetector are substantially vertical.

5. The semiconductor device of claim 2, wherein an upper surface of the waveguide structure is planar.

6. The semiconductor device of claim 5, wherein the upper surface of the waveguide structure is disposed below the upper surface of the photodetector.

7. The semiconductor device of claim 1, wherein:
   the opposite sidewalls of the photodetector comprise a first sidewall and a second sidewall;

the first sidewall and the second sidewall are laterally spaced in a first direction;
the photodetector has a third sidewall and a fourth sidewall that is opposite the third sidewall;
the third sidewall is laterally spaced from the fourth sidewall in a second direction that is perpendicular to the first direction; and
the waveguide structure extends laterally in the second direction away from the photodetector.

8. The semiconductor device of claim 7, wherein the waveguide structure contacts the third sidewall of the photodetector.

9. The semiconductor device of claim 8, further comprising:
a grating coupler structure disposed in the semiconductor substrate, wherein the grating coupler structure is configured to guide incident radiation into the waveguide structure, and wherein the waveguide structure extends laterally from the grating coupler structure to the third sidewall of the photodetector.

10. The semiconductor device of claim 7, wherein:
the waveguide structure has a square-like or rectangular-like profile along a first plane;
the first plane extends laterally in the first direction;
the photodetector has an elliptical-like profile along a second plane; and
the second plane extends laterally in the first direction and in parallel with the first plane.

11. The semiconductor device of claim 10, further comprising:
an isolation structure disposed in the semiconductor substrate, wherein:
the isolation structure has a first portion disposed on a first side of the photodetector and a second portion disposed on a second side of the photodetector opposite the first side of the photodetector;
the first portion of the isolation structure extends in the second direction and in parallel with the photodetector; and
the second portion of the isolation structure extends in the second direction and in parallel with the photodetector.

12. A semiconductor device, comprising:
a first doped region disposed in a semiconductor substrate and having a first doping type;
a second doped region disposed in the semiconductor substrate and having a second doping type different than the first doping type, wherein the first doped region and the second doped region are laterally spaced;
a waveguide structure disposed in the semiconductor substrate; and
a photodetector disposed at least partially in the semiconductor substrate, wherein the photodetector is laterally between the first doped region and the second doped region along a first direction in a plan-view and wherein the photodetector contacts the waveguide structure along a second direction in the plan-view, the first direction being perpendicular to the second direction; and
wherein:
the waveguide structure is configured to guide one or more photons into the photodetector;
the photodetector has an upper surface that continuously arcs between opposite sidewalls of the photodetector in a cross-sectional view; and
the photodetector has a lower surface that continuously arcs between the opposite sidewalls in the cross-sectional view; and
the first doped region and the second doped region contact the lower surface of the photodetector.

13. A semiconductor device, comprising:
a first doped region having a first doping type disposed in a semiconductor substrate;
a second doped region having a second doping type different than the first doping type disposed in the semiconductor substrate, wherein the first doped region and the second doped region are laterally spaced;
a waveguide structure disposed in the semiconductor substrate and laterally between the first doped region and the second doped region; and
a photodetector disposed at least partially in the semiconductor substrate and laterally between the first doped region and the second doped region, wherein:
opposite sidewalls of the photodetector comprise a first sidewall and a second sidewall, the first sidewall and the second sidewall are laterally spaced in a first direction;
the photodetector has a third sidewall and a fourth sidewall that is opposite the third sidewall, the third sidewall being laterally spaced from the fourth sidewall in a second direction that is perpendicular to the first direction;
the waveguide structure extends laterally in the second direction away from the photodetector and is configured to guide one or more photons into the photodetector;
the photodetector has an upper surface that continuously arcs between the opposite sidewalls; and
the photodetector has a lower surface that continuously arcs between the opposite sidewalls.

14. The semiconductor device of claim 13, wherein the waveguide structure comprises a first semiconductor material and the photodetector comprises a second semiconductor material that is different than the first semiconductor material.

15. The semiconductor device of claim 13, wherein the upper surface of the photodetector is vertically above a top surface of the semiconductor substrate.

16. The semiconductor device of claim 13, wherein the upper surface of the photodetector continuously extends between upper surfaces of the semiconductor substrate that are along opposing sides of the photodetector.

17. The semiconductor device of claim 13, wherein the first doped region is laterally separated from the second doped region by a region of the semiconductor substrate that is directly below the photodetector.

18. The semiconductor device of claim 13, wherein an upper surface of the waveguide structure is vertically offset from at least a part of the upper surface of the photodetector.

19. The semiconductor device of claim 13, wherein the photodetector has a width that is between about 0.3 micrometers and about 1.5 micrometers.

20. The semiconductor device of claim 13, wherein the photodetector has an elliptical-like profile along a cross-sectional view.

* * * * *